US012701977B2

(12) United States Patent
Cheng et al.

(10) Patent No.: US 12,701,977 B2
(45) Date of Patent: Aug. 4, 2026

(54) METHOD FOR FORMING A CONTACT PLUG WITH IMPROVED CONTACT METAL SEALING

(71) Applicant: TAIWAN SEMICONDUCTOR MANUFACTURING COMPANY, LTD., Hsinchu (TW)

(72) Inventors: Chung-Liang Cheng, Hsinchu (TW); Lin-Yu Huang, Hsinchu (TW); Li-Zhen Yu, Hsinchu (TW); Huang-Lin Chao, Hsinchu (TW); Pinyen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 865 days.

(21) Appl. No.: 17/847,863

(22) Filed: Jun. 23, 2022

(65) Prior Publication Data

US 2023/0420297 A1     Dec. 28, 2023

(51) Int. Cl.
*H10W 20/00*          (2026.01)
*H10W 20/42*          (2026.01)

(52) U.S. Cl.
CPC ....... *H10W 20/069* (2026.01); *H10W 20/051* (2026.01); *H10W 20/056* (2026.01); *H10W 20/076* (2026.01); *H10W 20/42* (2026.01)

(58) Field of Classification Search
CPC ......... H01L 21/76897; H01L 21/76831; H01L 21/76859; H01L 21/76877; H01L 23/5226; H01L 21/26506; H01L 21/743; H01L 21/76825; H01L 21/76876; H01L 23/485; H01L 21/76856; H01L 21/76843; H01L 21/28518; H01L 21/76855; H01L 21/76865; H01L 23/5286; H10W 20/069; H10W 20/051; H10W 20/056; H10W 20/076; H10W 20/42; H10W 20/033; H10W 20/045; H10W 20/40; H10W 20/481; H10W 20/047; H10W 20/048; H10W 20/054; H10W 20/427; H10W 20/021; H10W 20/095; H10D 64/01125; H10D 64/0112; H10P 30/204; H10P 30/208

See application file for complete search history.

(56) References Cited

U.S. PATENT DOCUMENTS 6,639,264 B1 *  10/2003  Loh .................. H01L 21/28247
                                                    257/E21.654
2001/0037994 A1 * 11/2001  Ezaki ................. H10W 20/032
                                                    216/75
2009/0200615 A1 *  8/2009  Kanegae ............ H10D 84/0133
                                                    257/E27.06

(Continued)

*Primary Examiner* — Yara B Green
*Assistant Examiner* — Akhee Sarker-Nag
(74) *Attorney, Agent, or Firm* — Birch, Stewart, Kolasch & Birch, LLP

(57)          ABSTRACT

A method is provided for forming a metal contact plug. In one step, a substrate, which is an Si substrate or an $SiO_2$ substrate, is etched to form a contact hole. In one step, a dielectric liner layer is formed on a sidewall of the contact hole. In one step, the metal contact plug that is in contact with the dielectric liner layer is formed in the contact hole. In one step, an implantation process is performed on the substrate, so as to implant dopants having an atomic size greater than that of Si into the substrate.

20 Claims, 22 Drawing Sheets

(56)          References Cited

U.S. PATENT DOCUMENTS

2013/0267083 A1* 10/2013 Suguro ................ H10P 30/225
                                               438/527
2019/0157148 A1*  5/2019 Hsieh ............... H01L 21/76897
2019/0341107 A1* 11/2019 Bertin ................. G11C 29/021
2022/0069100 A1*  3/2022 Hwang ............... H10D 62/121
2023/0197530 A1*  6/2023 Xie ....................... H10D 88/00
                                               257/302
2023/0402514 A1* 12/2023 Cheng ............... H10D 30/6729

* cited by examiner wafer frontside wafer backside

100

116

110

114

116

1

130

128

160

20

2

200 wafer backside wafer backside wafer backside wafer backside

METHOD FOR FORMING A CONTACT PLUG WITH IMPROVED CONTACT METAL SEALING

BACKGROUND

The semiconductor integrated circuit (IC) industry has over the past decades experienced tremendous advancements and is still experiencing vigorous development. With the dramatic advances in IC design, new generations of ICs have smaller and more complex structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 20 are schematic views illustrating the steps of the method in accordance with some embodiments.

FIG. 22 is a schematic view illustrating another variation in accordance with some embodiments.

DETAILED DESCRIPTION

Figure 1:
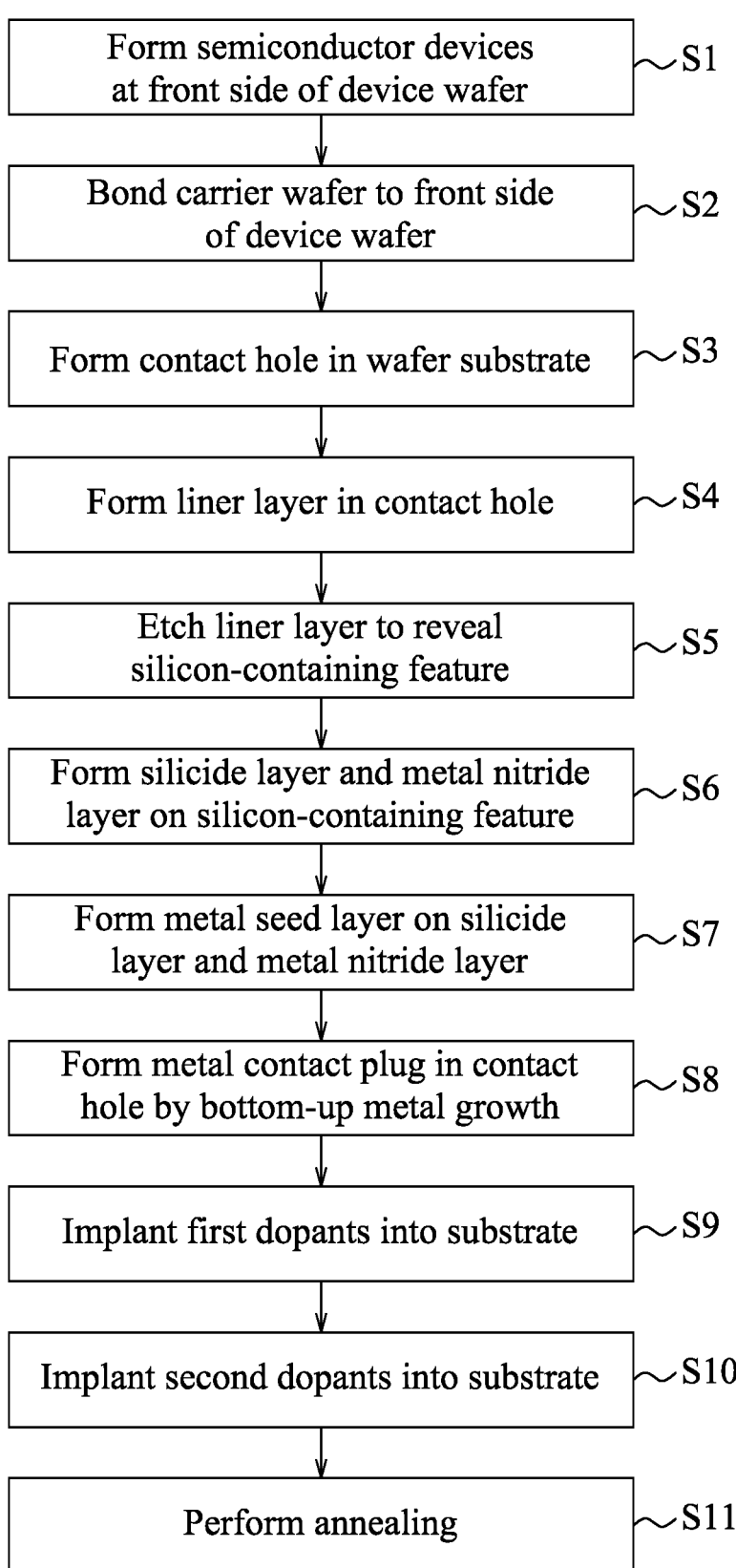
FIG. 1 is a flow chart illustrating steps of a method for forming a contact plug along with post treatment in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the advancement of semiconductor manufacturing technology, dimensions of semiconductor devices become smaller and smaller. Since the shrinkage of the device dimensions and/or device pitches may increase density of wires, a frontside portion of a wafer may have insufficient space to form all the wires therein. In order to address such a problem, some wires may be formed on a backside portion of the wafer, so the frontside portion of the wafer can have sufficient space for routing of the remaining wires. The wires that are selected to be formed on the backside portion of the wafer may be, for example but not limited to, power rails that may occupy larger spaces than other signal wires, other wires that are deemed suitable to be formed on the backside portion of the wafer by designers, or any combination thereof. In order to connect a wire that is formed on the backside portion of the wafer to a device that is formed on the frontside portion of the wafer, a metal contact plug may be formed in the backside portion of the wafer to electrically interconnect the wire and the device. To form the metal contact plug, a contact hole (e.g., a via hole or a trench, which is a long, narrow hole) would be formed in the backside portion of the wafer, and a metal layer is then deposited to fill the contact hole. In accordance with some embodiments, a metal glue layer, such as a TiN layer, is formed between the metal contact plug and the substrate, so as to enhance adhesion between the metal contact plug and the non-metal substrate. In such a scenario, since a sidewall of the contact hole is formed with the metal glue layer thereon, and a growth rate of the metal layer on the metal glue layer is high, bottom-up metal growth of the metal layer would not be induced. Further, since the backside portion of the wafer is usually thick, the contact hole formed in the backside portion of the wafer usually has a large aspect ratio (i.e., a ratio of a depth to a width (e.g., a top width) of the contact hole), and the contact hole may thus be sealed by the metal layer that is grown from the sidewall of the contact hole before the lower portion of the contact hole is completely filled, so voids and/or seams may be formed in the metal contact plug, resulting in high electrical resistance.

FIG. 1 is a flow chart that cooperates with FIGS. 2 through 20 to illustrate steps of a method for forming a contact plug by bottom-up metal growth along with post treatment in accordance with some embodiments. The bottom-up metal growth can avoid formation of voids and/or seams in the contact plug, so as to achieve low electrical resistance for the contact plug. The post treatment can prevent the contact plug from being damaged in subsequent processes, so as to avoid degradation of structural properties. In the illustrative embodiment, the contact plug is formed on a backside portion of a substrate (e.g., a wafer substrate), but this disclosure is not limited in this respect. In accordance with some embodiments, the method may be used to form the contact plug on a frontside portion of the substrate.

Figure 2:
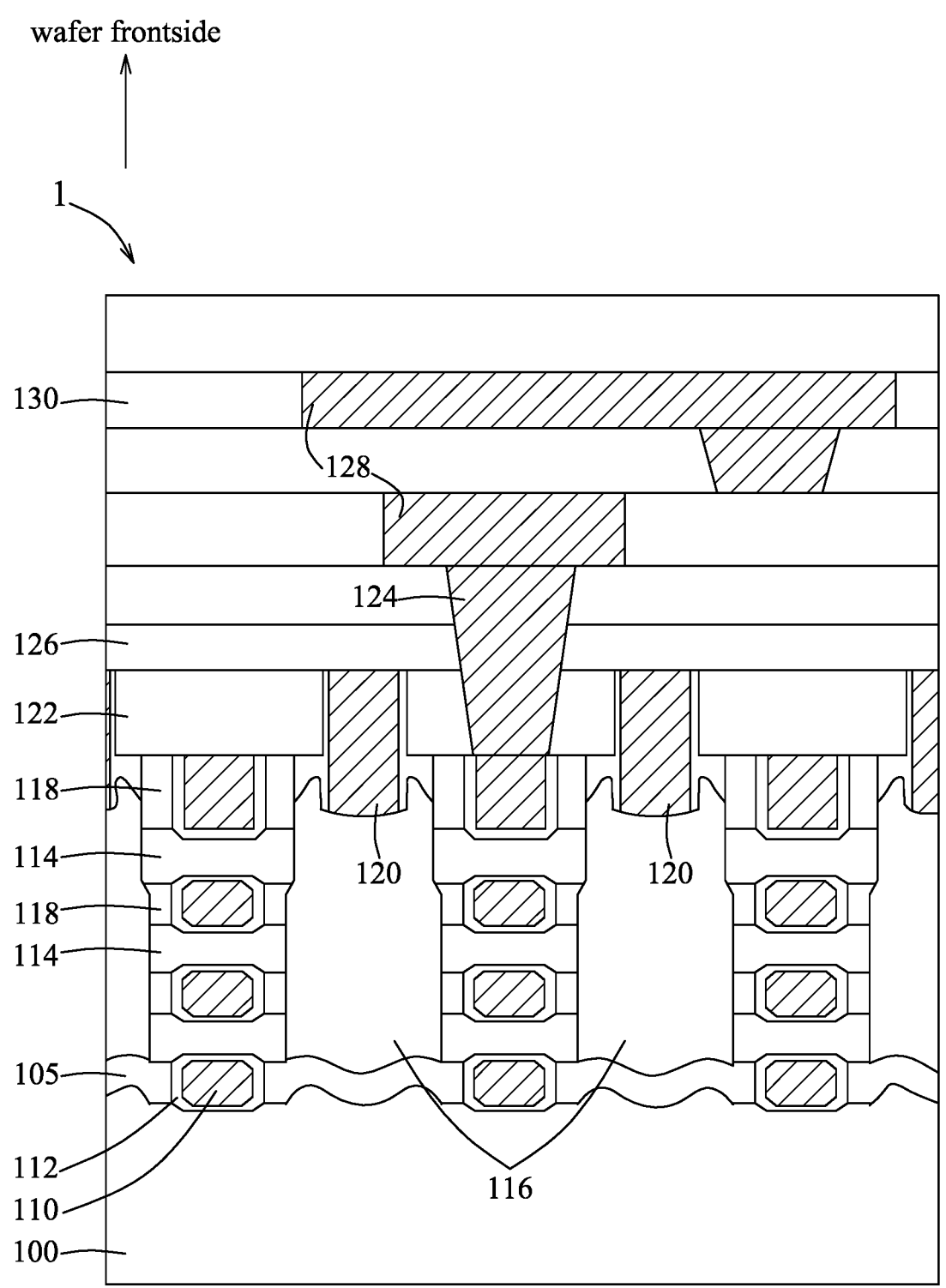

Referring to FIGS. 1 and 2, in step S1, a device wafer 1 is exemplarily provided to include a plurality of circuit components on a frontside portion of a substrate 100. The substrate 100 has a frontside surface and a backside surface that are opposite to each other, and the frontside surface is above the backside surface when a frontside direction is considered an upward direction. The substrate 100 may be a bulk semiconductor substrate or a semiconductor-on-insulator (SOI) substrate, which may be doped (e.g., with a p-type or an n-type dopant) or undoped. In some embodiments, an SOI substrate includes a layer of a semiconductor material formed on an insulator layer. The insulator layer may be a buried oxide (BOX) layer, a silicon oxide layer or any other suitable layer. The insulator layer may be provided on a suitable substrate, such as silicon, glass or the like. The substrate 100 may be made of a suitable semiconductor material, such as silicon or the like. In some embodiments, the substrate 100 is a silicon wafer; and in other embodiments, the substrate 100 is made of a compound semiconductor such as silicon carbide, gallium arsenide, indium arsenide, indium phosphide or other suitable materials. In still other embodiments, the substrate 100 is made of an alloy semiconductor such as GaAsP, AlInAs, AlGaAs, GaInAs, GaInP, GaInAsP or other suitable materials.

In some embodiments, the substrate 100 includes various p-type doped regions and/or n-type doped regions, such as p-type wells, n-type wells, p-type source/drain features and/or n-type source/drain features (source/drain feature(s) may refer to a source or a drain, individually or collectively depending upon the context), formed by a suitable process such as ion implantation, thermal diffusion, a combination thereof, or the like. In some embodiments, the substrate 100 may include other functional elements such as resistors, capacitors, diodes, transistors, and/or the like. The transistors are, for example, field effect transistors (FETs), such as planar FETs and/or 3D FETs (e.g., FinFETs, GAAFETs). The substrate 100 may include lateral isolation features (e.g., shallow trench isolation (STI)) configured to separate various functional elements formed on and/or in the semiconductor substrate 100.

In the illustrative embodiment, the circuit components are semiconductor devices, and more particularly, are exemplified as gate-all-around field-effect transistors (GAAFETs). Each of the semiconductor devices includes a gate electrode feature 110, multiple channel features 114 that are surrounded by the gate electrode feature 110, a gate dielectric 112 that is disposed between the gate electrode feature 110 and the channel features 114, a pair of source/drain features 116 that are disposed at opposite sides of the gate electrode feature 110 and that are connected to the channel features 114, and spacers 118 that are disposed between the gate electrode feature 110 and the source/drain features 116. The source/drain features 116 may refer to a source or a drain, individually or collectively dependent upon the context. In other embodiments, the semiconductor devices may include other types of circuit components, such as FinFETs, other suitable components, or any combination thereof, and this disclosure is not limited in this respect.

In accordance with some embodiments, the gate electrode feature 110 may include, for example, Cu, Ti, TiN, W, Al, Co, Ru, TiAlC, TaAlC, other suitable materials, or any combination thereof. In accordance with some embodiments, the channel features 114 may include, for example, Si, compound semiconductor, alloy semiconductor, other suitable materials, or any combination thereof. In accordance with some embodiments, the gate dielectric 112 may include, for example, a high-k material such as hafnium oxide, lanthanum oxide, etc., other suitable materials, or any combination thereof. In accordance with some embodiments, the source/drain features 116 are silicon-containing features that include silicon. In accordance with some embodiments, the source/drain features 116 are formed by, for example, epitaxial growth of silicon, other suitable techniques, or any combination thereof. In accordance with some embodiments, the spacers 118 may include, for example, silicon oxide, silicon nitride, oxygen-doped silicon nitride, carbon-doped silicon nitride, silicon carbide, other suitable low-k materials (e.g., having a dielectric constant smaller than 3.9), or any combination thereof. During the formation of the spacers 118, an isolation layer 105 may also be formed on the substrate 100, so as to enhance electrical isolation between the substrate 100 and the source/drain features 116. In the illustrative embodiment, a first dielectric layer 122 is formed over the semiconductor devices, and several metal contacts 120 are formed in the first dielectric layer 122 to electrically connect the source/drain features 116 to other circuit elements. A second dielectric layer 126 is formed over the first dielectric layer 122, a frontside interlayer dielectric (ILD) 130 is formed on the second dielectric layer 122, and multiple metal wire layers 128 are formed in the frontside interlayer dielectric 130 and over the semiconductor devices in the frontside direction (upwards in FIG. 2). In the illustrative embodiment, one of the metal wire layers 128 is electrically connected to the gate electrode feature 110 of one of the semiconductor devices through a gate contact via 124 that is formed in the frontside interlayer dielectric 130, the second dielectric layer 126 and the first dielectric layer 122. In accordance with some embodiments, the first dielectric layer 122 may include, for example, silicon oxide, silicon nitride, silicon carbide, silicon oxynitride, silicon oxycarbide, a low-k material, other suitable materials, or any combination thereof. In accordance with some embodiments, the metal contacts 120 may include, for example, Co, W, Ru, Cu, Al, Mo, Ti, Ni, Au, Pt, Pd, other suitable materials, or any combination thereof. In accordance with some embodiments, the second dielectric layer 126 may include, for example, silicon oxide, silicon nitride, silicon carbide, silicon oxynitride, silicon oxycarbide, a low-k material, other suitable materials, or any combination thereof. In the illustrative embodiment, the first dielectric layer 122 is made of silicon dioxide or a low-k material for reducing a resistive-capacitive (RC) delay of the entire circuit, and the second dielectric layer 126 is made of silicon nitride to enhance electric isolation and to serve as an etch stop layer, but this disclosure is not limited to such. In accordance with some embodiments, the frontside interlayer dielectric 130 may include, for example, silicon oxide, silicon nitride, silicon oxynitride, silicon carbonitride, silicon carbide oxynitride, spin-on glass (SOG), phosphosilicate glass (PSG), borophosphosilicate glass (BPSG), FSG, carbon doped silicon oxide (e.g., SiCOH), polyimide, other suitable materials, or any combination thereof. In accordance with some embodiments, the metal wire layers 128 and the gate contact via 124 may include, for example, Co, W, Ru, Cu, Al, Mo, Ti, Ni, Au, Pt, Pd, other suitable materials, or any combination thereof.

Figure 3:
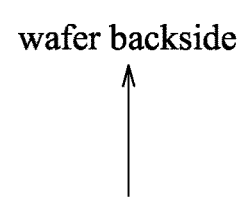

Referring to FIGS. 1 and 3, in step S2, a carrier wafer 2 is bonded to the frontside portion of the device wafer 1 where the semiconductor devices are formed. The carrier wafer 2 includes a substrate 200, and a bonding layer 20 formed on the substrate 200. The substrate 200 may be a semiconductor substrate that is made of, for example, silicon, a compound semiconductor such as silicon carbide, gallium arsenide, indium arsenide, indium phosphide, an alloy semiconductor such as GaAsP, AlInAs, AlGaAs, GaInAs, GaInP, GaInAsP, or other suitable materials. In the illustrative embodiment, the device wafer 1 and the carrier wafer 2 are connected together by oxide-oxide wafer bonding. The bonding layer 20 may be, for example, a silicon oxide ($SiO_x$) layer. The device wafer 1 is also provided with a bonding layer 160 (e.g., a silicon oxide layer) on top of the device wafer 1, when viewed in the frontside direction. In accordance with some embodiments, the bonding layer 20 of the carrier wafer 2 may have a thickness greater than 200 angstroms to achieve good bonding.

Figure 4:
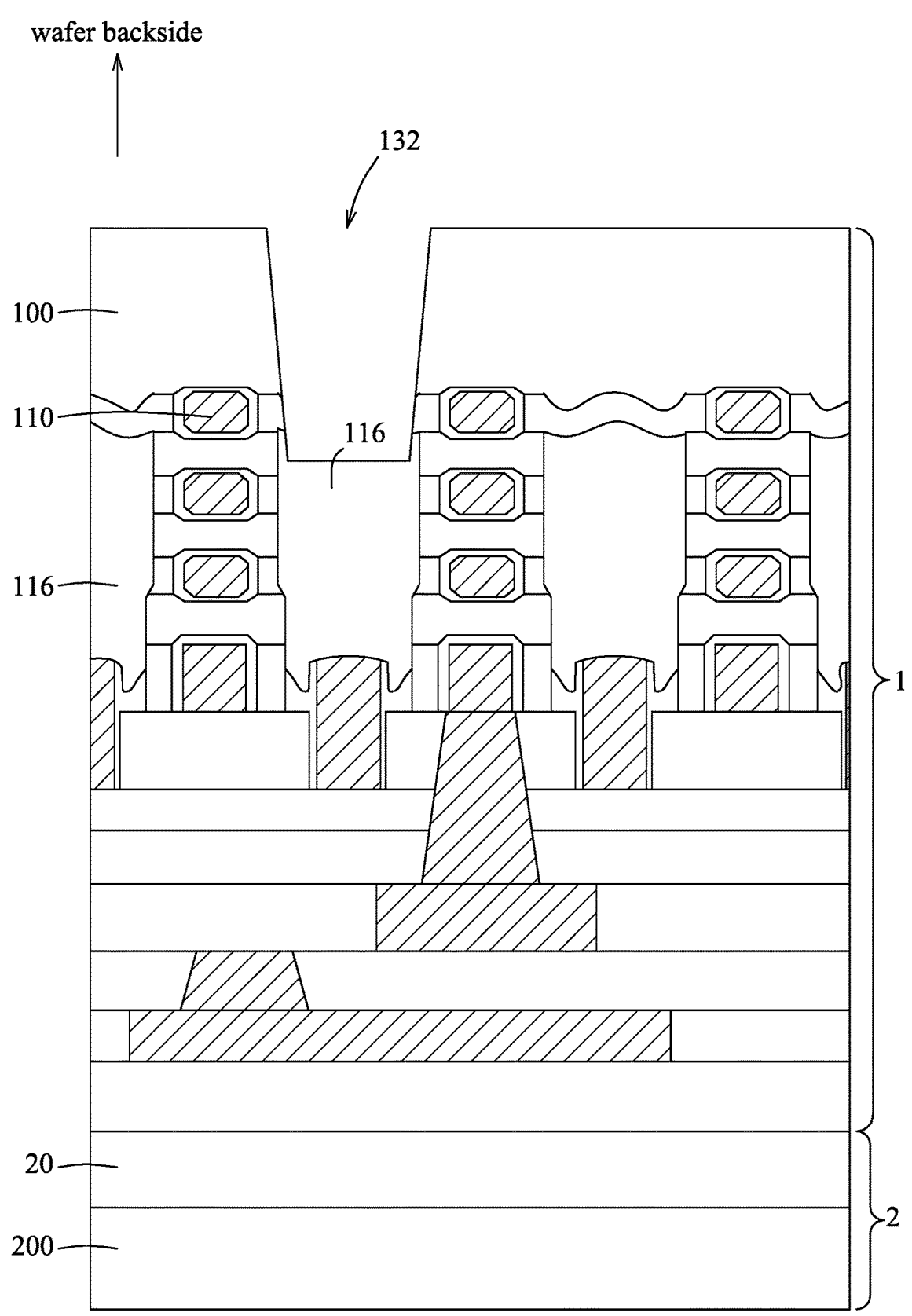

Referring to FIGS. 1 and 4, in step S3, a backside portion of the substrate 100 is etched to form a contact hole 132 in the backside surface of the substrate 100, wherein the contact hole 132 is disposed above the semiconductor devices when viewed in a backside direction opposite to the frontside direction. The contact hole 132 exposes one of the source/drain features 116 (referred to as silicon-containing feature 116 hereinafter) that is disposed in the substrate 100. In some embodiments, the substrate 100 may be the original semiconductor substrate as described above. In some embodiments, before step S3, the original semiconductor substrate may be removed from the backside of the device wafer 1, and a dielectric material, such as SiO$_2$, may be deposited to form a new substrate 100. In other words, in the subsequent backside process, the substrate 100 may be made of, for example, Si, SiO$_2$, other suitable materials, or any combination thereof. In accordance with some embodiments, the substrate 100 may be etched using, for example, wet etching, dry etching, other suitable techniques, or any combination thereof.

Figure 5:
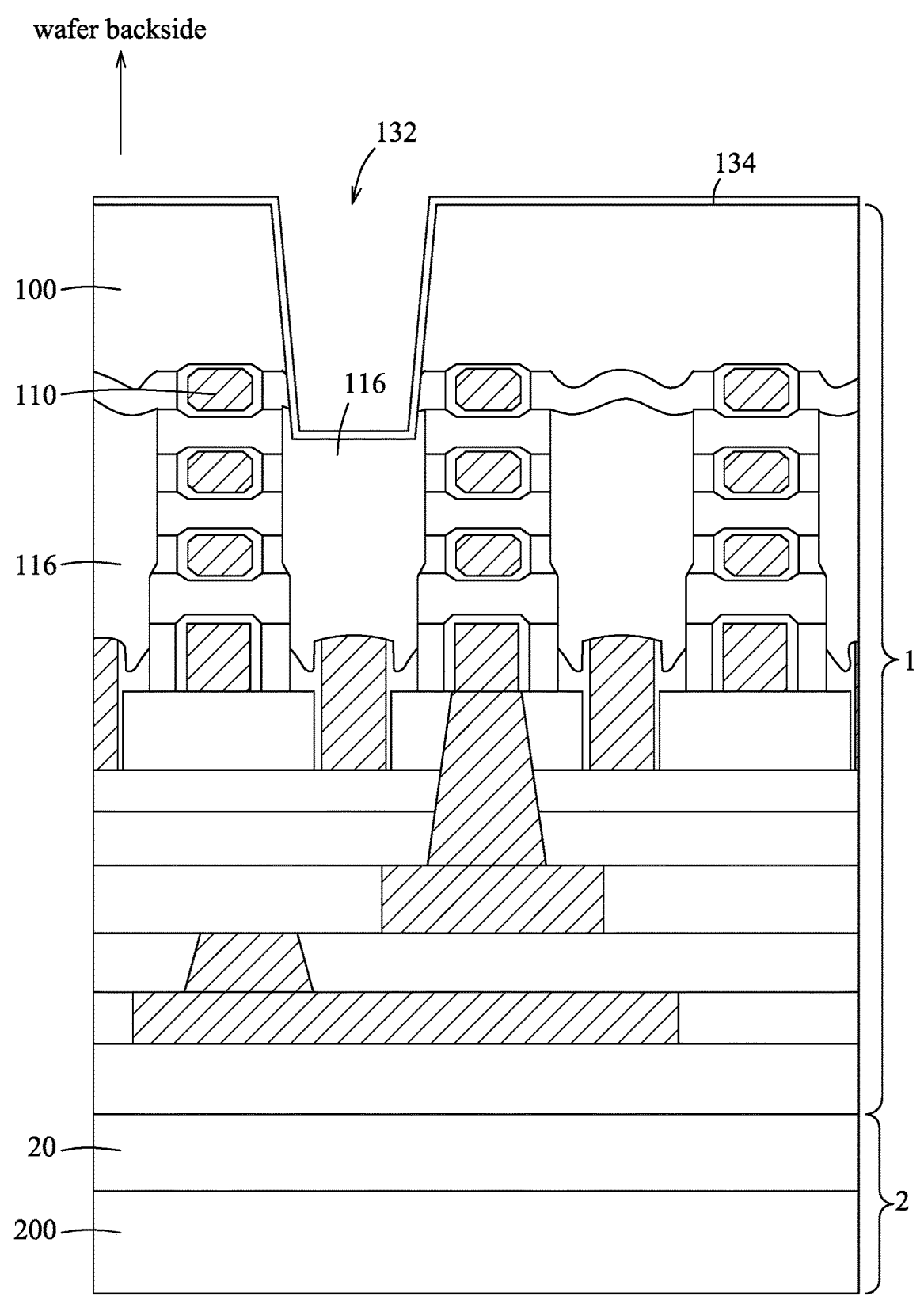

Referring to FIGS. 1 and 5, in step S4, a dielectric liner layer 134 is conformally formed on the backside portion of the substrate 100 and in the contact hole 132. In accordance with some embodiments, the dielectric liner layer 134 may include, for example, SiN, SiCN, SiOCN, other suitable materials, or any combination thereof, and may be formed using, for example, atomic layer deposition (ALD), other suitable techniques, or any combination thereof. The dielectric liner layer 134 is used to prevent current leakage from the contact plug, which will be subsequently formed in the contact hole 132, into the substrate 100.

Figure 6:
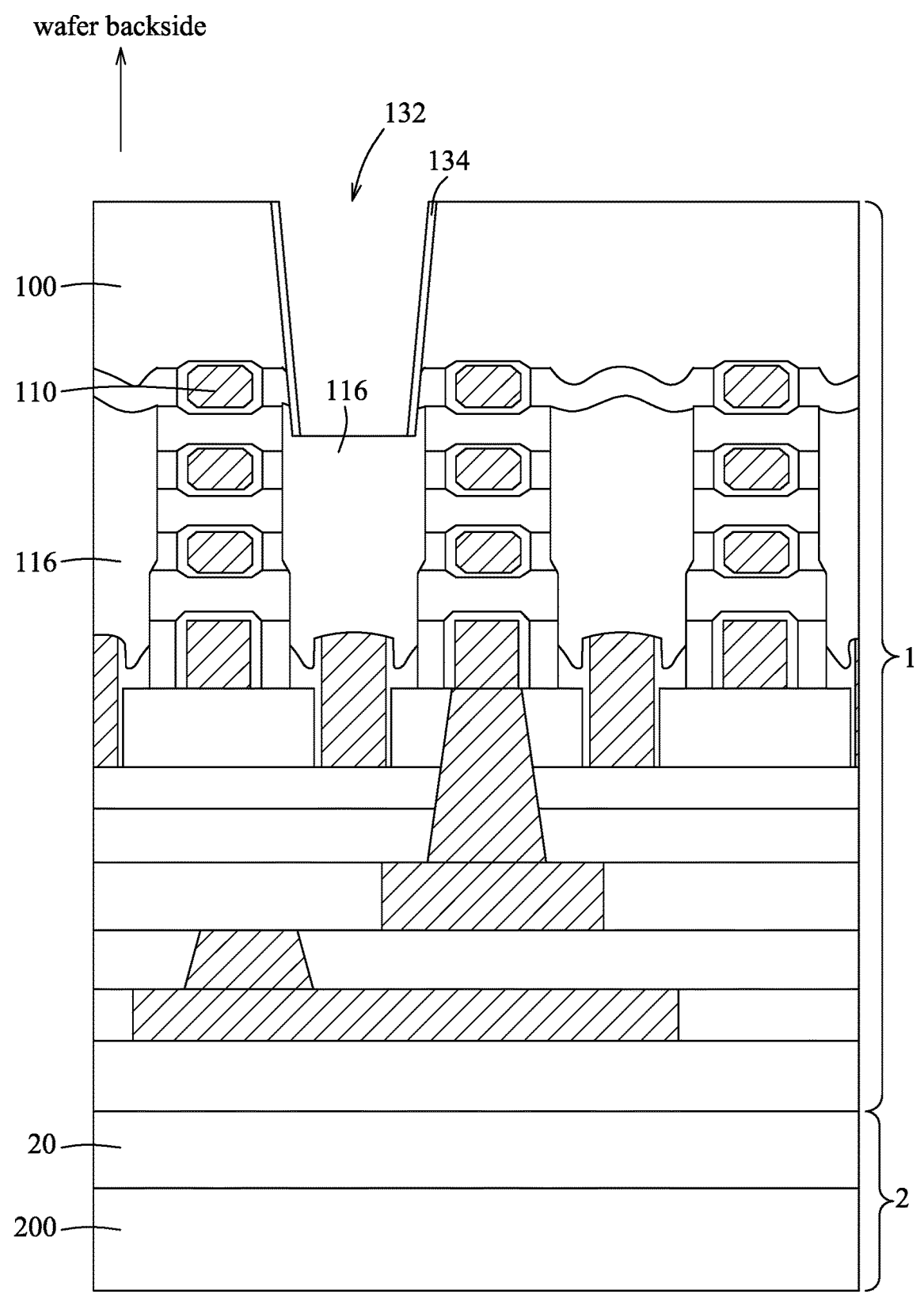

Referring to FIGS. 1 and 6, in step S5, when the backside direction is considered the upward direction, a portion of the dielectric liner layer 134 that is disposed at a bottom of the contact hole 132 and a portion of the dielectric liner layer 134 that is disposed over a top surface of the substrate 100 are etched, so that the silicon-containing feature 116 is revealed at the bottom of the contact hole 132, while the remaining portion of the dielectric liner layer 134 is still attached to a sidewall of the contact hole 132. In accordance with some embodiments, the dielectric liner layer 134 may be etched using an anisotropic dry etching technique, such as reactive-ion etching (RIE), ion beam etching (IBE), other suitable techniques, or any combination thereof.

Figure 7:
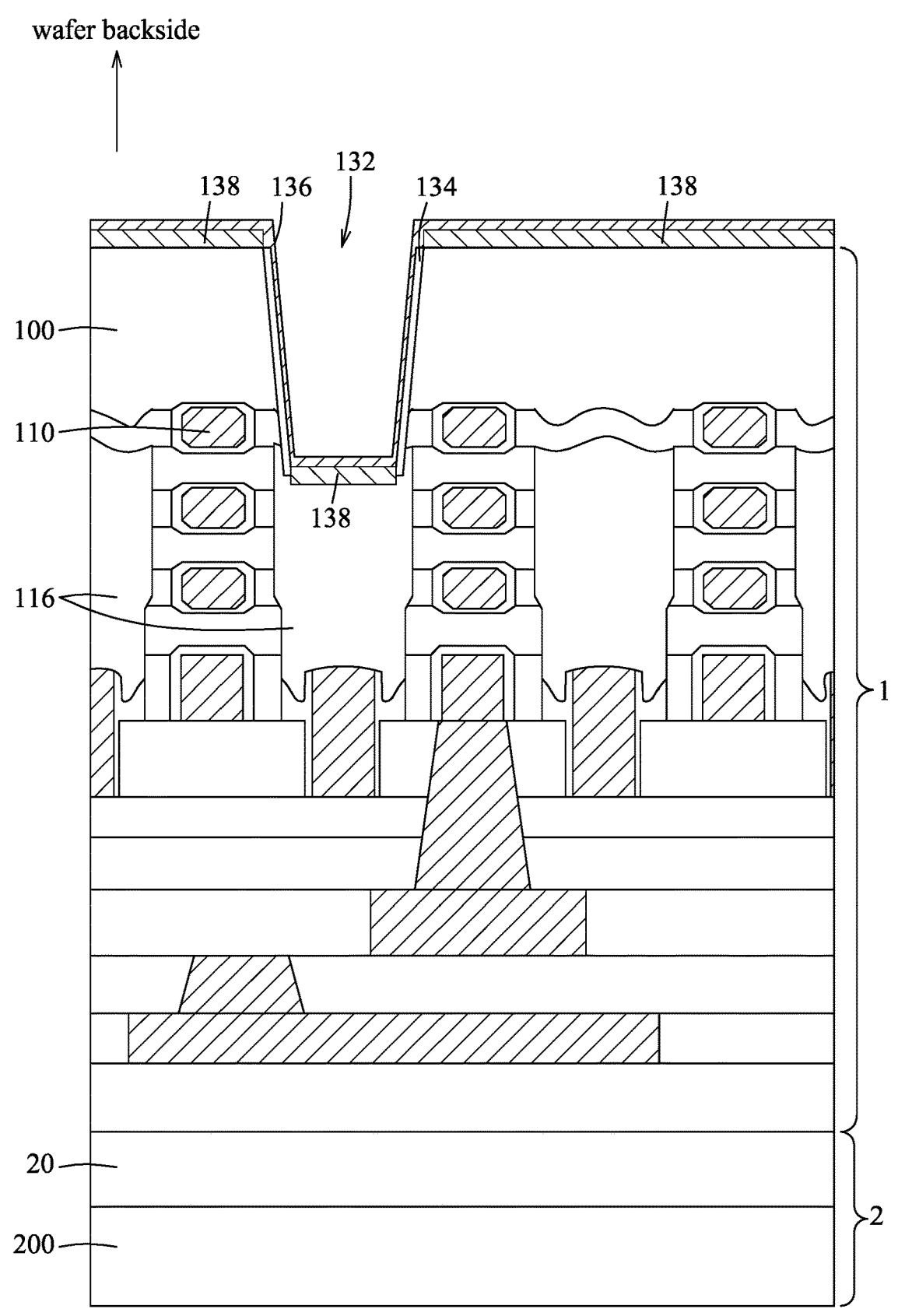
Figure 8:
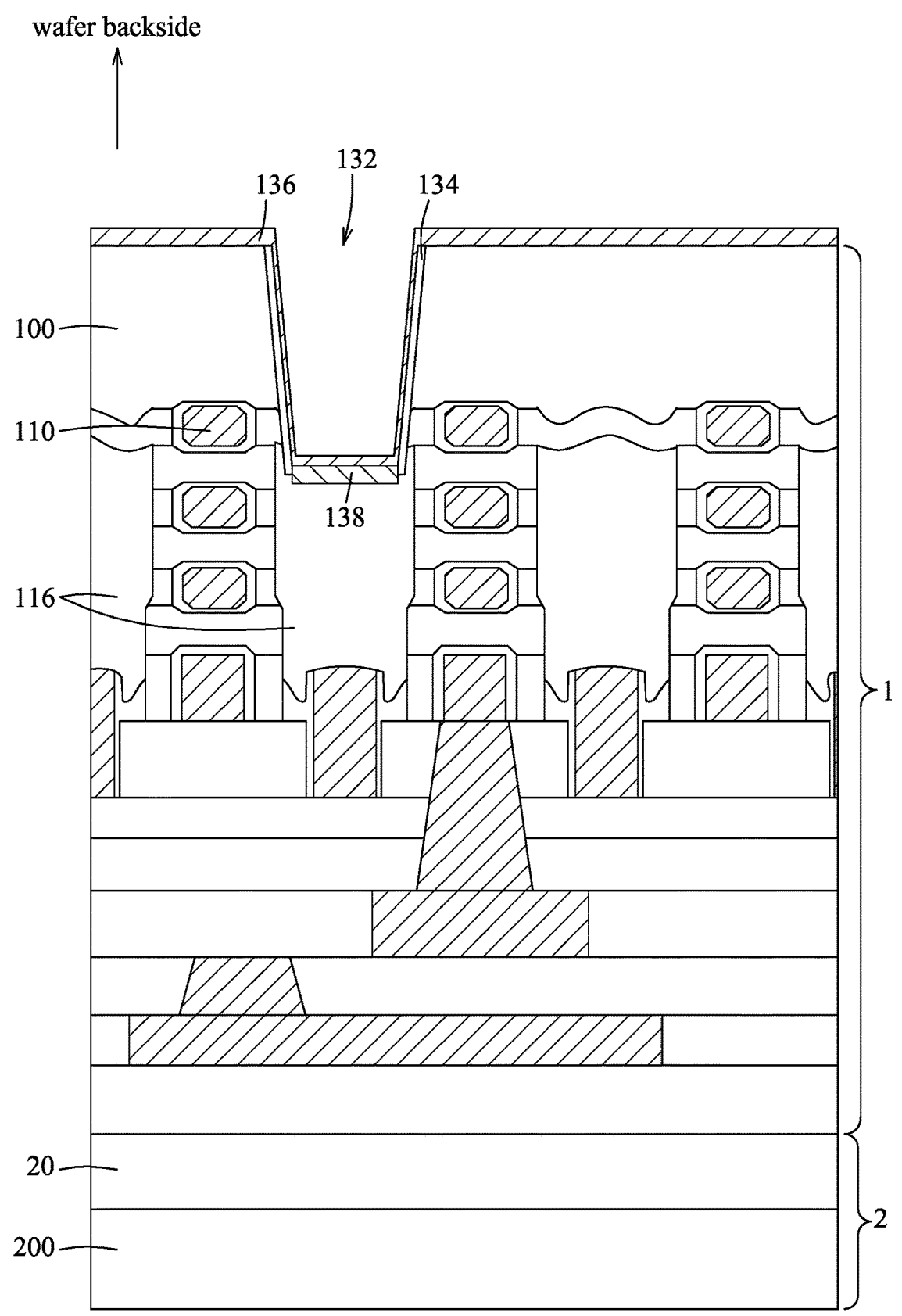

Referring to FIGS. 1 and 7 or FIGS. 1 and 8, in step S6, a silicide layer 138 is formed over the silicon-containing feature 116, so as to reduce contact resistance between the contact plug and the silicon-containing feature 116, where FIG. 7 illustrates a case where the substrate 100 is made of silicon, and FIG. 8 illustrates a case where the substrate 100 is made of SiO$_2$. In detail, a preclean process is first performed to remove native oxide that is formed over the exposed silicon-containing feature 116. In accordance with some embodiments, the preclean process may be performed using NF$_3$+NH$_3$ plasma to transform the native oxide into (NH$_4$)$_2$SiF$_6$, and an annealing process to sublimate the (NH$_4$)$_2$SiF$_6$. After the preclean process, a metal film 136 is conformally deposited on the backside portion of the substrate 100 and in the contact hole 132, and the metal film 136 reacts with the silicon-containing feature 116 to form the silicide layer 138 at an interface between the silicon-containing feature 116 and the metal film 136. In accordance with some embodiments, the metal film 136 may include, Ti, Ni, Co, W, Pt, other suitable materials, or any combination thereof, so the silicide layer 138 may be, for example, Ti silicide, Ni silicide, Co silicide, W silicide, Pt silicide, other types of silicide, or any combination thereof. In accordance with some embodiments where the silicide layer 138 is made of Ti silicide, the silicide layer 138 may be formed using, for example, chemical vapor deposition (CVD) that employs TiCl$_4$ and hydrogen at a process temperature in a range from about 350° C. to about 500° C. In accordance with some other embodiments where the silicide layer 138 is made of Ti silicide, the silicide layer 138 may be formed using, for example, physical vapor deposition (PVD) to conformally form a Ti layer on the backside portion of the substrate 100 and in the contact hole 132, followed by an annealing process that may have a process temperature in a range from about 500° C. to about 600° C. to induce silicidation at the interface between the silicon-containing feature 116 and the Ti layer. However, this disclosure is not limited to specific methods or specific materials for forming the silicide layer 138. Since the metal film 136 tends to be formed on silicon rather than on dielectric material, the metal film 136 is barely formed on the sidewall of the contact hole 132 in FIGS. 7 and 8 because of the dielectric liner layer 134, which is made of a dielectric material. In FIG. 7, the metal film 136 reacts with the silicon substrate 100, so the silicide layer 138 is also formed at the interface between the metal film 136 and the substrate 100. In FIG. 8, the metal film 136 does not react with the SiO$_2$ substrate 100, so the silicide layer 138 is formed only on the silicon-containing feature 116, which is exposed at the bottom of the contact hole 132.

In accordance with some embodiments, after the deposition of the metal film 136, a nitridation process is performed in step S6 to transform the metal film 136 into a metal nitride layer, so as to prevent underlayer oxidation. The nitridation process may include a plasma treatment that uses a gas including nitrogen, other suitable techniques, or any combination thereof. In accordance with some embodiments, the plasma treatment may be performed using, for example, N$_2$ plasma, N$_2$+H$_2$ plasma, other suitable techniques, or any combination thereof.

Figure 9:
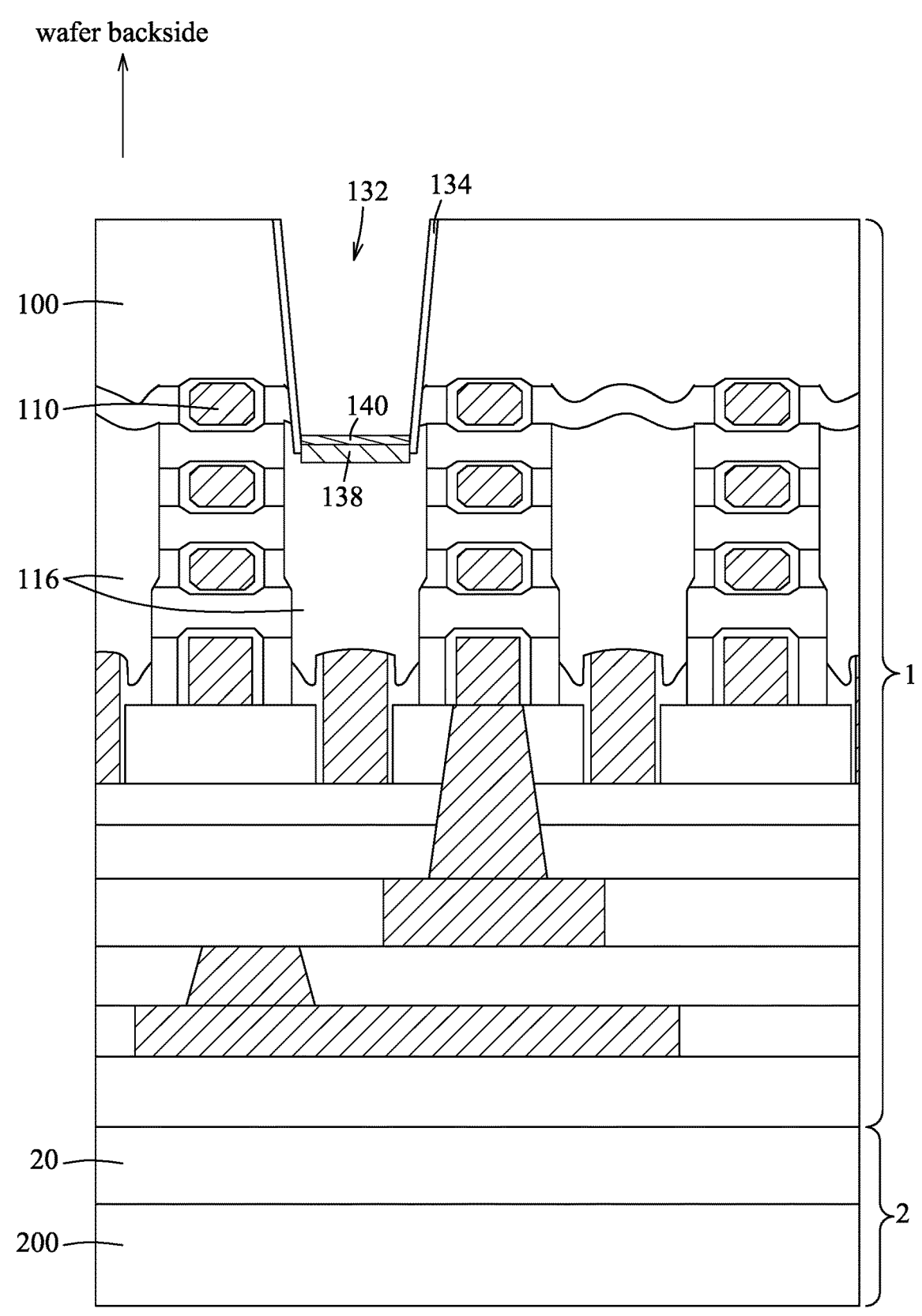

Referring to FIGS. 1 and 9, the metal nitride layer is etched to remove a portion of the metal nitride layer that is outside of the contact hole 132 and a portion of the metal nitride layer that is disposed on the sidewall of the contact hole 132, while a portion of the metal nitride layer (referred to as protective layer 140 hereafter) that is disposed at the bottom of the contact hole 132 and over the silicide layer 138 remains. In accordance with some embodiments, the metal nitride layer may be etched using isotropic dry etching, other suitable techniques, or any combination thereof. The isotropic dry etching may use a chlorine-based etchant, such as BCl$_3$, but this disclosure is not limited in the respect. Because of the high aspect ratio of the contact hole 132, the etching process can be controlled such that the protective layer 140 is not removed by the isotropic etching and remains over the silicide layer 138 to prevent the silicide layer 138 from oxidation. Since the silicide layer 138 and the protective layer 140 are both transformed from the metal film 136, the silicide layer 138 and the protective layer 140 have the same metal element. In the case that the substrate 100 is a silicon substrate, a portion of the silicide layer 138 that is formed over the top surface of the substrate 100 (see FIG. 7) may be removed after the etching of the metal nitride layer using, for example, wet etching, dry etching, other suitable techniques, or any combination thereof. In accordance with some embodiments, the silicide layer 138 formed at the bottom of the contact hole 132 may have a thickness in a range from about 3 nm to about 6 nm, and the protective layer 140 may have a thickness in a range from about 1 nm to about 2 nm, but this disclosure is not limited in this respect. An excessively thick protective layer 140 (e.g., greater than 2 nm in thickness) may result in undesired large electrical resistance between the subsequently formed contact plug and the silicon-containing feature 116, and an excessively thin protective layer 140 (e.g., smaller than 1 nm in thickness) may not effectively prevent underlayer oxidation.

Figure 10:
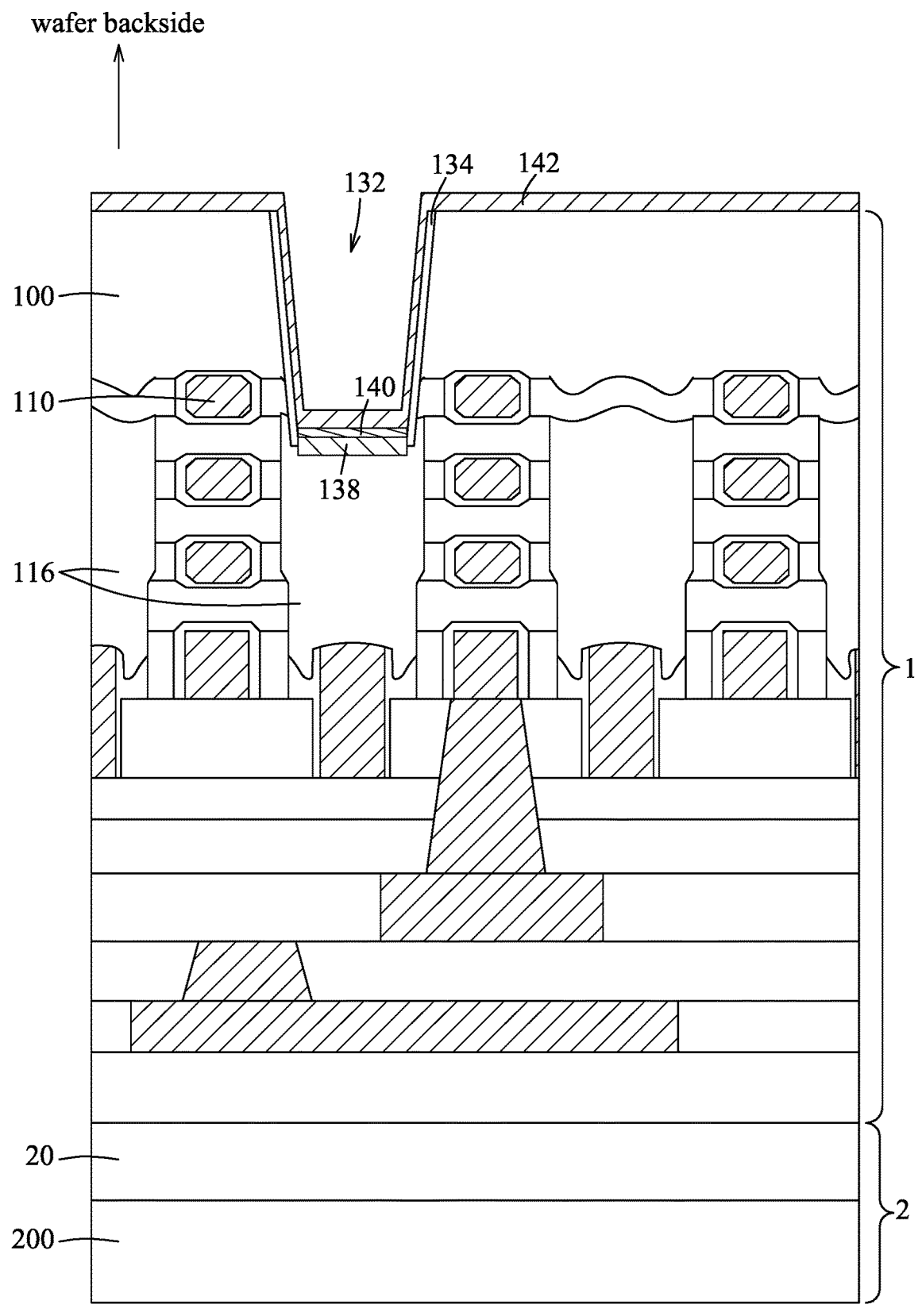
Figure 11:
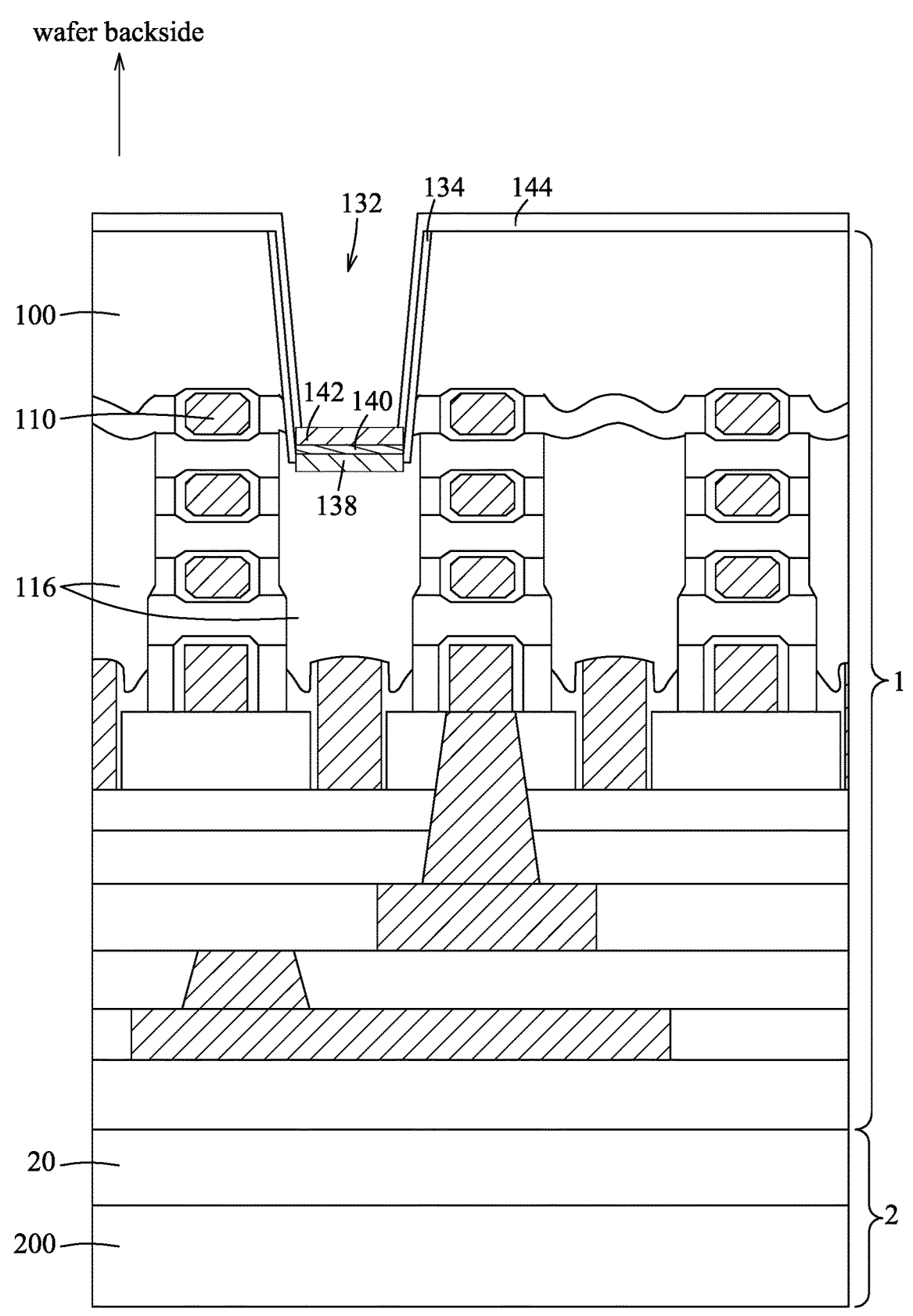
Figure 12:
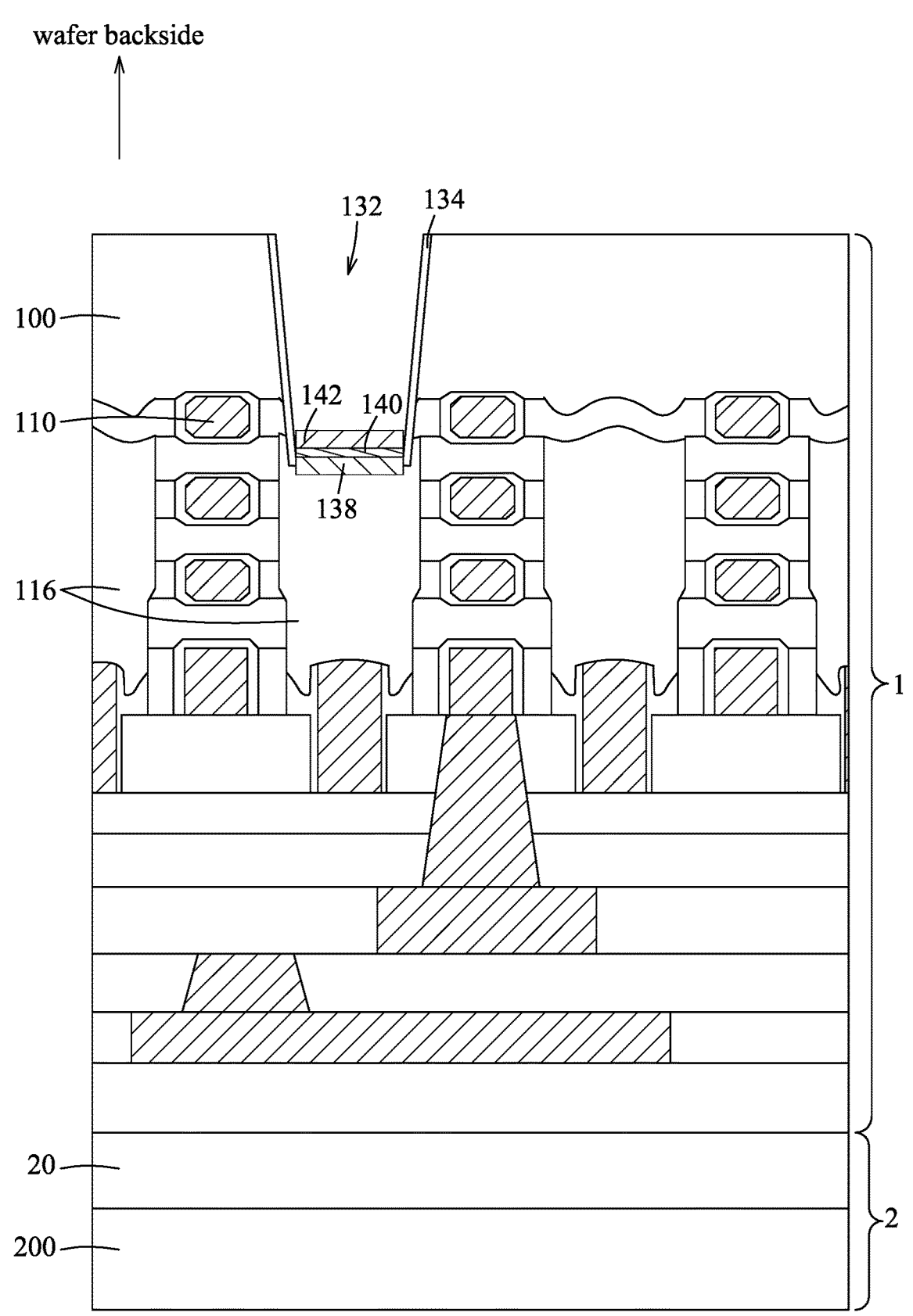

Referring to FIGS. 1 and 10 through 12, in step S7, a metal seed layer 142 is formed over the silicide layer 138 and the protective layer 140. In FIG. 10, a metal film (also denoted by the reference numeral 142) is conformally deposited over the substrate 100 and in the contact hole 132. In accordance with some embodiments, the metal film 142 may include, for example, W, Mo, Ru, Co, other suitable materials with low electrical resistivity, or any combination thereof, and may be formed using, for example, directional PVD, other suitable techniques, or any combination thereof, so that the metal film 142 is thick at the bottom of the contact hole 132 and is thin on the sidewall of the contact hole 132. In accordance with some embodiments, a portion of the metal film 142 at the bottom of the contact hole 132 may have a thickness in a range from about 5 nm to about 8 nm. In FIG. 11, a portion of the metal film 142 that is outside of the contact hole 132 and a portion of the metal film 142 that is on the sidewall of the contact hole 132 is transformed into a metal oxide layer 144. In accordance with some embodiments, the metal oxide layer 144 may be formed by performing a plasma treatment (e.g., $O_2$ plasma) that uses a gas including oxygen on the metal film 142, other suitable techniques, or any combination thereof. In accordance with some embodiments, the plasma treatment is performed with zero bias to make the plasma treatment non-directional, so that, because of the high aspect ratio of the contact hole 132, a portion of the metal film 142 that is disposed at the bottom of the contact hole 132 will not be oxidized. In FIG. 12, the metal oxide layer 144 is removed, and only the portion of the metal film 142 that is disposed at the bottom of the contact hole 132 remains on the metal nitride layer 140, serving as the metal seed layer 142. In accordance with some embodiments, the metal oxide layer 144 may be removed using, for example, isotropic dry etching, other suitable techniques, or any combination thereof. The isotropic dry etching may use, for example, a chlorine-based etchant, but this disclosure is not limited in this respect.

Figure 13:
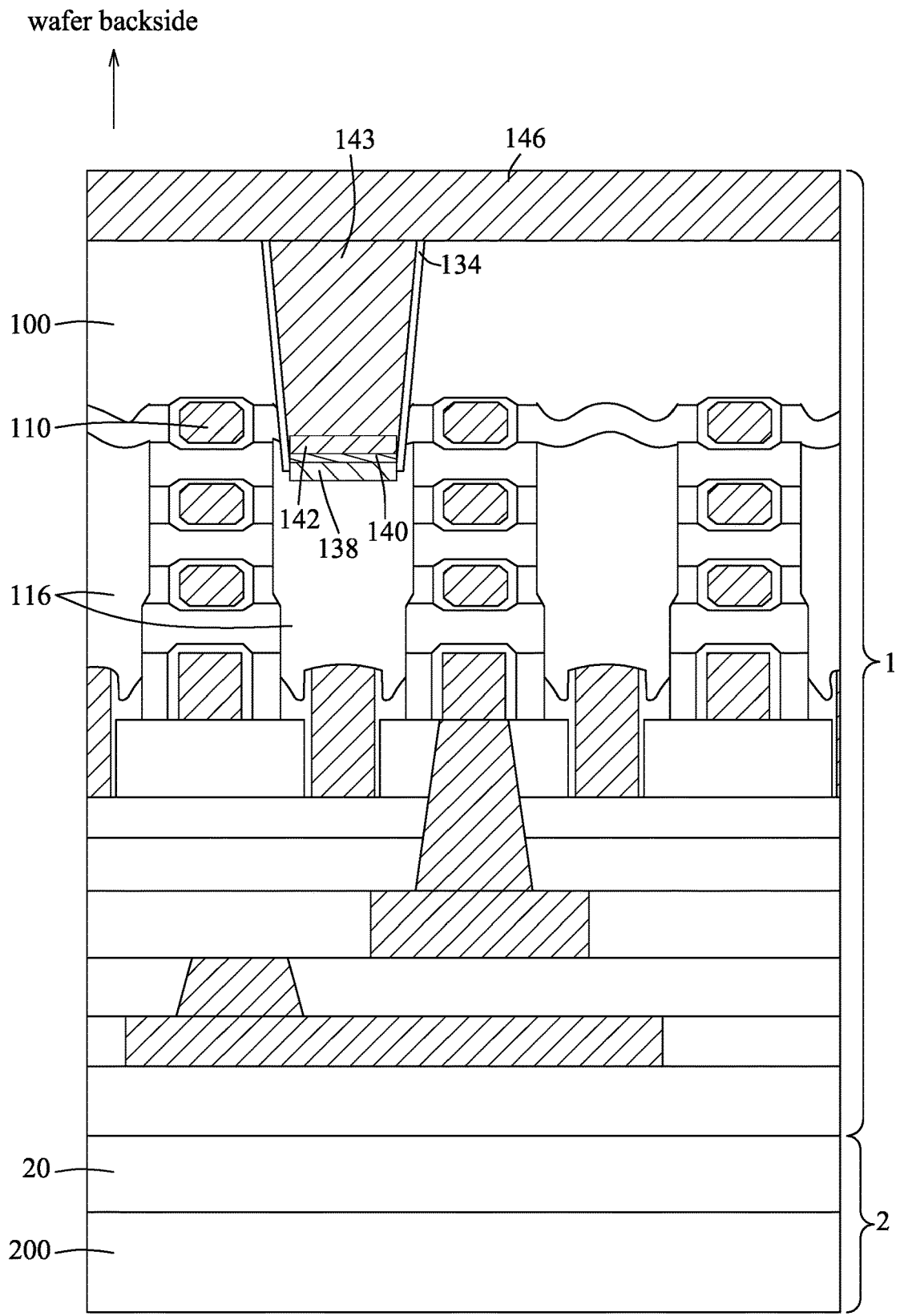
Figure 14:
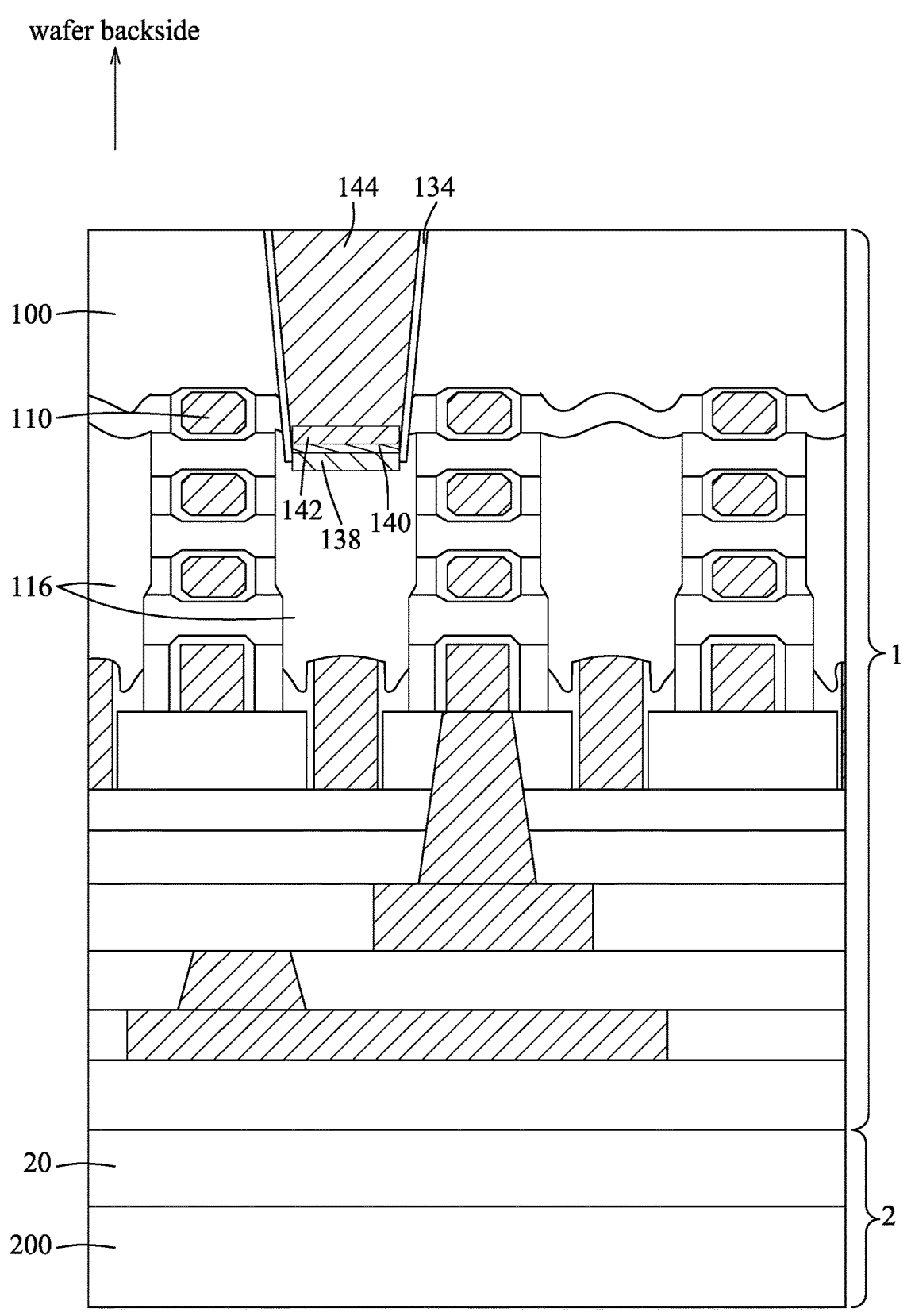

Referring to FIGS. 1 and 13, in step S8, a metal contact layer 143 is deposited over the metal seed layer 142, so as to form the contact plug in the contact hole 132 (see FIG. 12) in a manner of bottom-up growth. In accordance with some embodiments, the metal contact layer 143 may include, for example, W, Mo, Ru, Co, other suitable materials, or any combination thereof, and may be formed using, for example, CVD, ALD, other suitable techniques, or any combination thereof. By using the techniques such as CVD or ALD with a chlorine-base precursor, the metal thus deposited tends to be formed only on metals (e.g., the metal seed layer 142), and is barely formed on dielectrics (e.g., the dielectric liner layer 134), so the metal contact layer 143 is formed in a manner of bottom-up growth. In general, the bottom-up metal growth prevents formation of voids or seams in the metal contact layer 143, so the resultant metal contact plug will have better electrical resistance. It is noted that the metal contact layer 143 and the metal seed layer 142 may be made of either the same material or different materials, and this disclosure is not limited in this respect. After the contact hole 132 is filled or almost filled with the metal contact layer 143, an additional metal layer 146 is deposited on the metal contact layer 143 and the substrate 100 for the subsequent planarization process. In accordance with some embodiments, the metal layer 146 may be deposited using, for example, PVD, other suitable techniques, or any combination thereof. In FIG. 14, a chemical-mechanical planarization (CMP) process is performed to planarize and reveal the top surface of the substrate 100, so as to form the contact plug 144 with a flat top surface. The contact plug 144 is exposed from the top surface of the substrate 100, and has a first end portion (e.g., a top portion in FIG. 14) and a second end portion (e.g., a bottom portion in FIG. 14) that are opposite to each other, with the second end portion being closer to the silicon-containing feature 116 than the first end portion.

In the illustrative embodiment, the dielectric liner layer 134 is disposed between a lateral surface of the contact plug 144 and the substrate 100, and the contact plug 144 is in contact with the dielectric liner layer 134, with no metal glue layer between the contact plug 144 and the dielectric liner layer 134. In order to prevent the contact plug 144 from metal loss in subsequent processes (e.g., an etching process that may cause an etching gas to enter into spaces, if any, between the contact plug 144 and the dielectric liner layer 134, or a CMP process that may cause a CMP slurry to flow into the spaces between the contact plug 144 and the dielectric liner layer 134), the following post treatment is introduced to enhance metal sealing of the contact hole 132, thereby blocking entrance of the etching gas and/or the CMP slurry into the spaces between the contact plug 144 and the dielectric liner layer 134.

Figure 15:
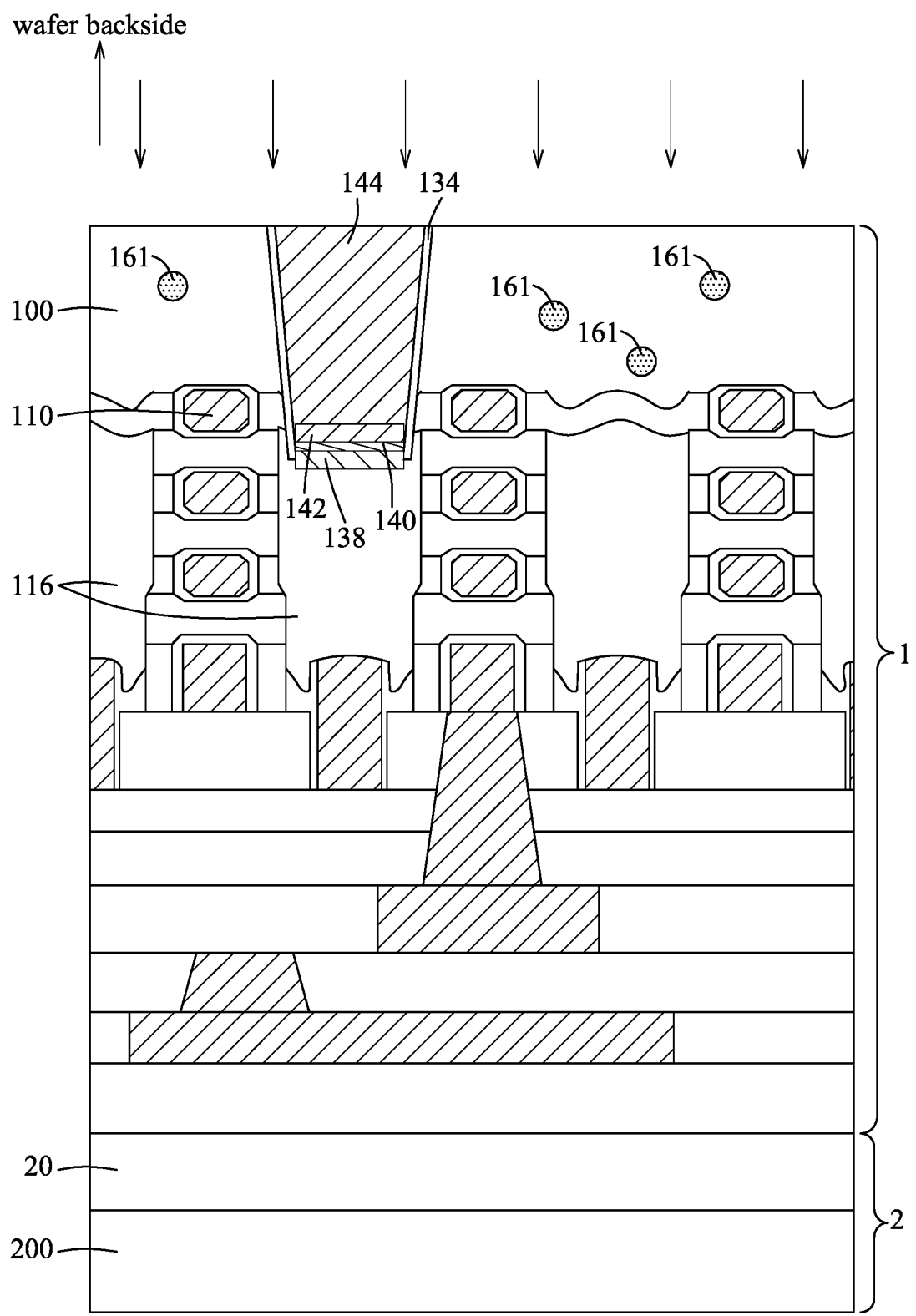

Referring to FIGS. 1 and 15, in step S9, an implantation process is performed to implant a plurality of first dopants 161 into the top surface of the substrate 100 where the contact plug 144 is exposed. The first dopants 161 have an atomic size that is greater than that of Si, which is contained in the substrate 100, and thus would fill into the substrate 100 and push some atoms or compounds originally in the substrate 100 (e.g., Si or $SiO_2$) against the dielectric liner layer 134, thereby making tiny, invisible spaces between the contact plug 144 and the dielectric liner layer 134 disappear. As a result, good metal sealing of the contact hole can be achieved to prevent the etching gas and/or the CMP slurry from flowing into the spaces between the contact plug 144 and the dielectric liner layer 134. To be specific, the implantation is performed such that the first dopants 161 are mainly distributed in a near-surface portion of the substrate 100 that surrounds the first end portion of the contact plug 144. In accordance with some embodiments, the first dopants 161 include Ge, Sn, Pb, other suitable materials, or any combination thereof.

Figure 16:
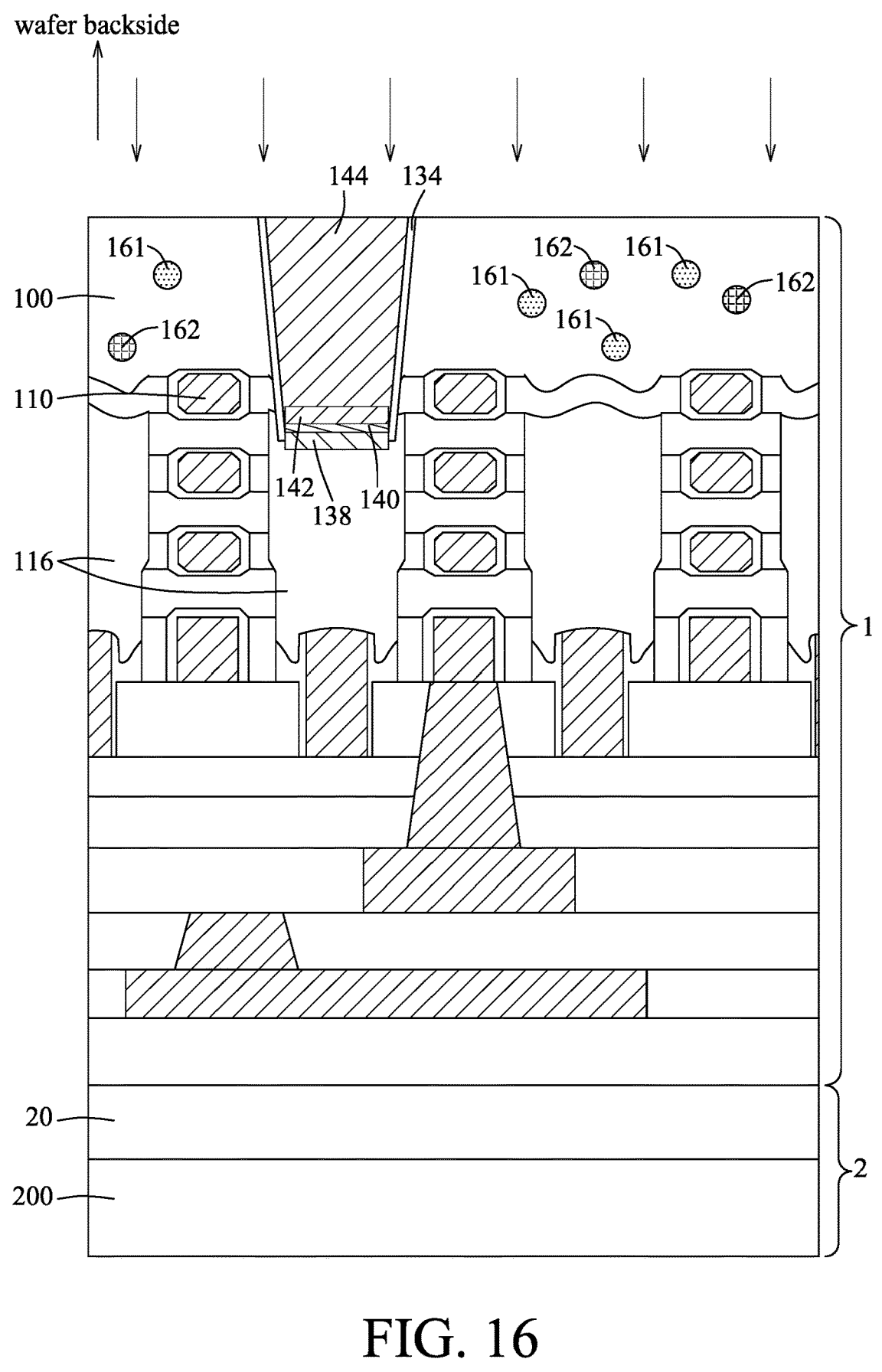

Referring to FIGS. 1 and 16, in step S10, an implantation process is performed to implant a plurality of second dopants 162 into the top surface of the substrate 100 where the contact plug 144 is exposed. In accordance with some embodiments, the implantation of the second dopants 162 is performed when the substrate 100 is made of a dielectric material, such as $SiO_2$, and the second dopants 162 include carbon, fluorine, other suitable materials, or any combination thereof. The resultant substance created by the implantation of the second dopants 162, such as SiOC, SiOF, etc., may make the substrate 100 have a looser structure with a lower dielectric constant, thereby reducing the RC delay of the entire circuit. Similarly, the implantation may be performed such that the second dopants 162 are mainly distributed in the near-surface portion of the substrate 100 that surrounds the first end portion of the contact plug 144. In accordance with some embodiments, the implantation of the second dopants 162 may be performed prior to the implantation of the first dopants 161. In accordance with some embodiments, the implantation of the second dopants 162 may be omitted.

Figure 17:
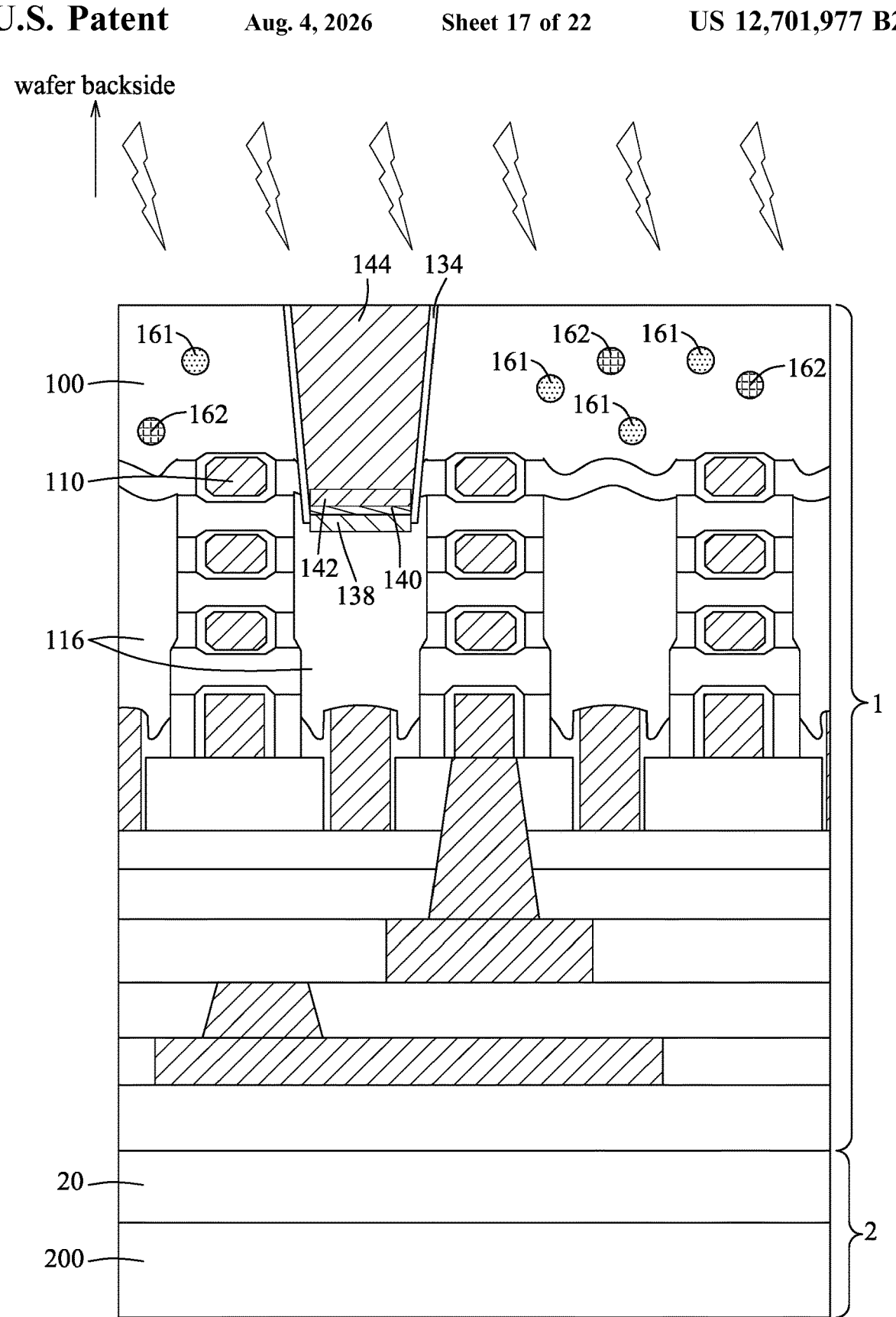

Referring to FIGS. 1 and 17, in step S11, an annealing process is performed for restoring damages resulting from the implantation of the first dopants 161 and the implantation of the second dopants 162, if step S10 is performed, and for diffusing the first dopants 161 and the second dopants 162 deeper into the substrate 100 (closer to the wafer frontside). In accordance with some embodiments, the annealing process has a process temperature in a range from about 400° C. to 500° C. An excessively high process temperature (e.g., higher than 500° C.) may cause shift of device properties (e.g., a threshold voltage of transistors), and an excessively low process temperature (e.g., lower than 400° C.) may be insufficient to induce the restoration of the damage from the implantation(s).

Figure 18:
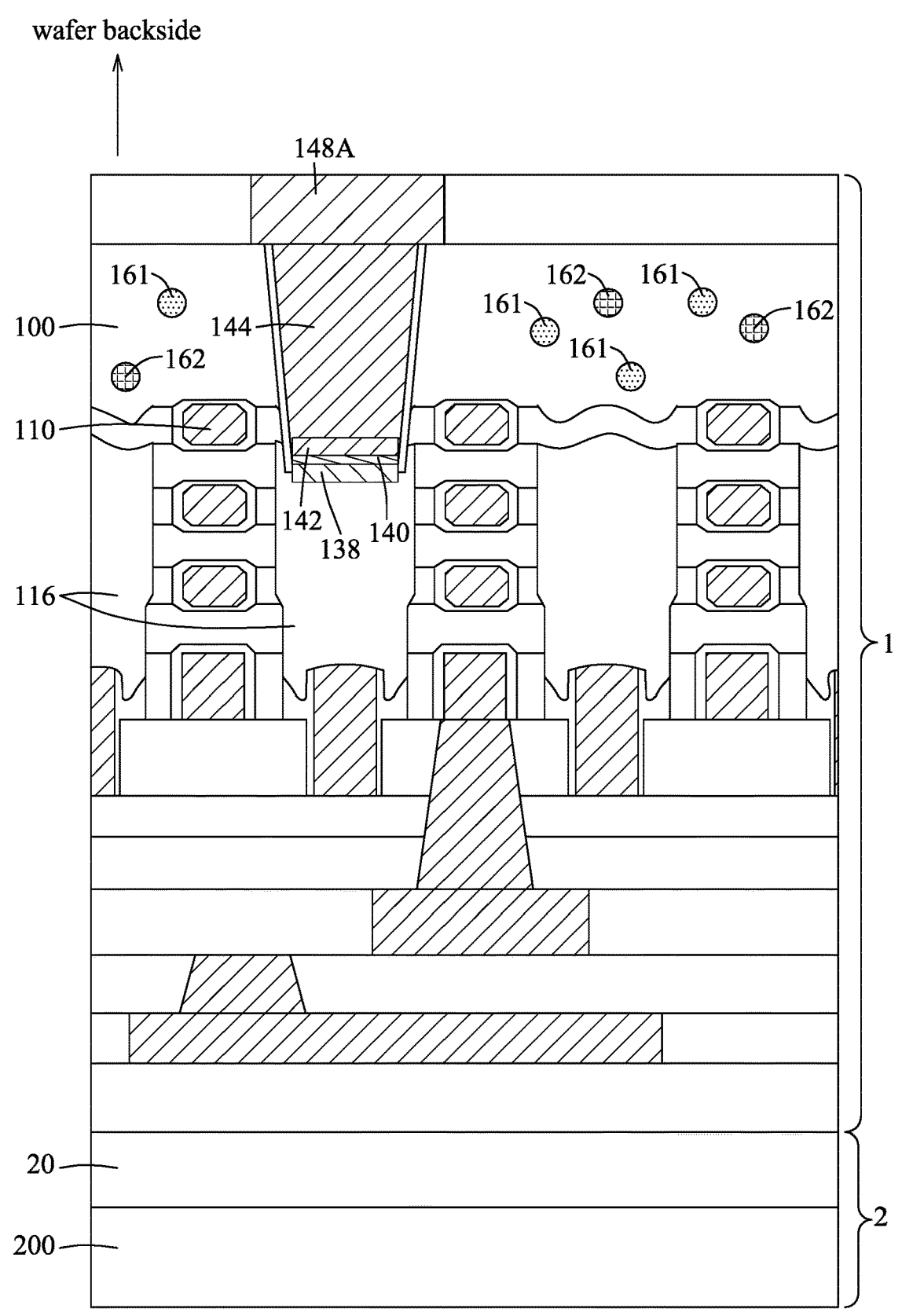
Figure 19:
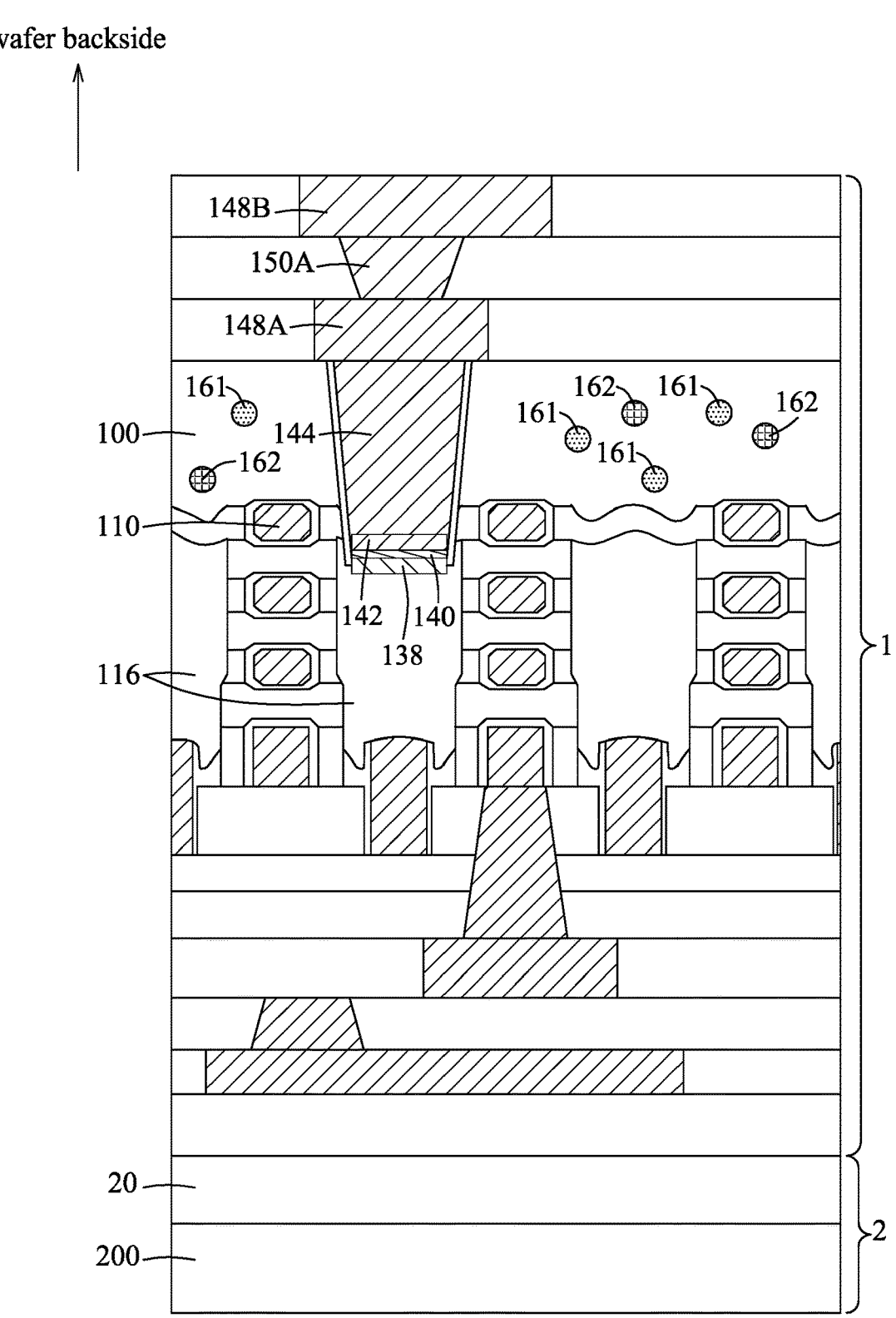
Figure 20:
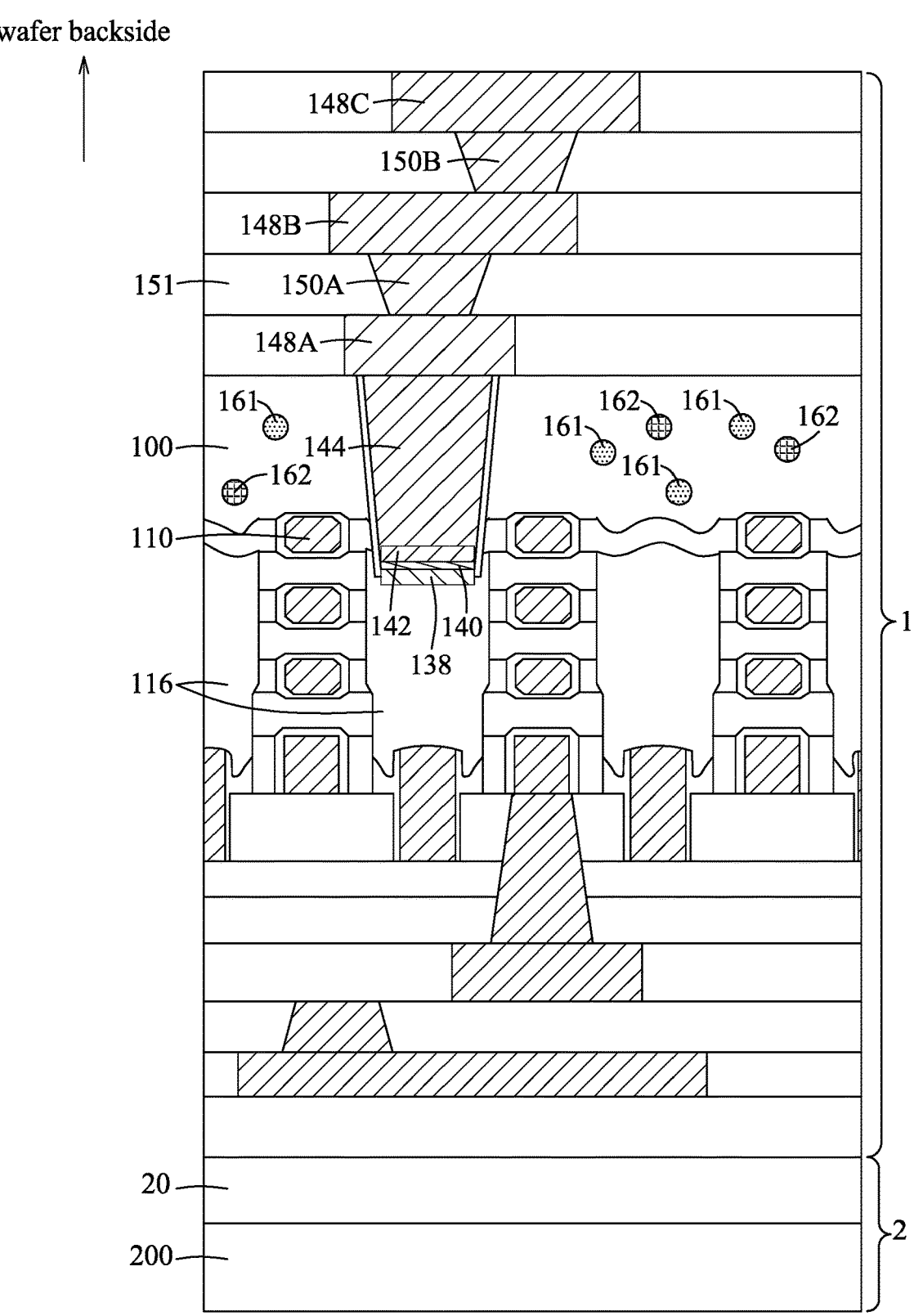

Referring to FIGS. 18 through 20, a plurality of metal wire layers are exemplarily formed above the semiconductor devices when viewed in the backside direction. In FIG. 18, a first metal wire layer 148A is formed to be in contact with the contact plug 144. In FIG. 19, a second metal wire layer 148B is formed to be electrically connected to the first metal wire layer 148A through a first contact via 150A. In FIG. 20, a third metal wire layer 148C is formed to be electrically connected to the second metal wire layer 148B through a second contact via 150B. In accordance with some embodiments, the metal wire layers 148A, 148B, 148C and the contact vias 150A, 150B may include, for example, Co, W, Ru, Cu, Al, Mo, Ti, Ni, Au, Pt, Pd, other suitable materials, or any combination thereof, and are formed in a backside interlayer dielectric 151. In accordance with some embodiments, the backside interlayer dielectric 151 may include, for example, silicon oxide, silicon nitride, silicon oxynitride, silicon carbonitride, silicon carbide oxynitride, SOG, PSG, BPSG, FSG, carbon doped silicon oxide (e.g., SiCOH), polyimide, other suitable materials, or any combination thereof. In accordance with some embodiments, the metal wire layers 148A, 148B, 148C form power rails for transmission of electrical power to the semiconductor devices that are formed at the frontside of the substrate 100, where the first metal wire layer 148A is electrically connected to the silicon-containing feature 116, which is the source/drain feature of the GAAFET in the illustrative embodiment.

In the illustrative embodiment, the contact hole 132 (see FIGS. 4 through 12) and the resultant contact plug 144 (see FIGS. 14 through 20) has an aspect ratio (e.g., a height-to-width ratio) in a range from about 3 to about 8. If the aspect ratio is excessively small (e.g., smaller than 3), the portion of the metal nitride layer that is disposed at the bottom of the contact hole 132 may be removed during the etching of the metal nitride layer, and the portion of the metal film 142 that is disposed at the bottom of the contact hole 132 may be oxidized during the oxidation process. In such a condition, the protective layer 140 and/or the metal seed layer 142 may not be successfully formed, and the bottom-up metal growth of the contact plug 144 may not be realized. If the aspect ratio is excessively large (e.g., greater than 8), the reactants for forming the silicide layer 138, the protective layer 140 and/or the metal seed layer 142 may not reach the bottom of the contact hole 132, resulting in a low manufacturing yield.

In accordance with some embodiments, when the backside direction is considered the upward direction, a top opening of the contact hole 132 and a top portion of the contact plug 144 may have a width in a range from about 10 nm to about 50 nm. For the top opening of the contact hole 132 and the top portion of the contact plug 144, an excessively large width (e.g., greater than 50 nm) may increase difficulty in overlay control, and an excessively small width (e.g., smaller than 10 nm) may lead to difficulty in formation of the required films/layers at the bottom of the contact hole 132. In accordance with some embodiments, a bottom of the contact hole 132 and a bottom portion of the contact plug 144 may have a width in a range from about 8 nm to about 45 nm. For the bottom of the contact hole 132 and the bottom portion of the contact plug 144, an excessively large width (e.g., greater than 45 nm) may increase difficulty in overlay control, and an excessively small width (e.g., smaller than 8 nm) may lead to insufficient formation of the silicide layer 138 at the bottom of the contact hole 132. In accordance with some embodiments, a height of the contact hole 132 and a height of the contact plug 144 may be determined based on the desired aspect ratio and the desired width for the top portion of the contact plug 144, and usually fall within a range from about 10 nm to about 80 nm.

Figure 21:
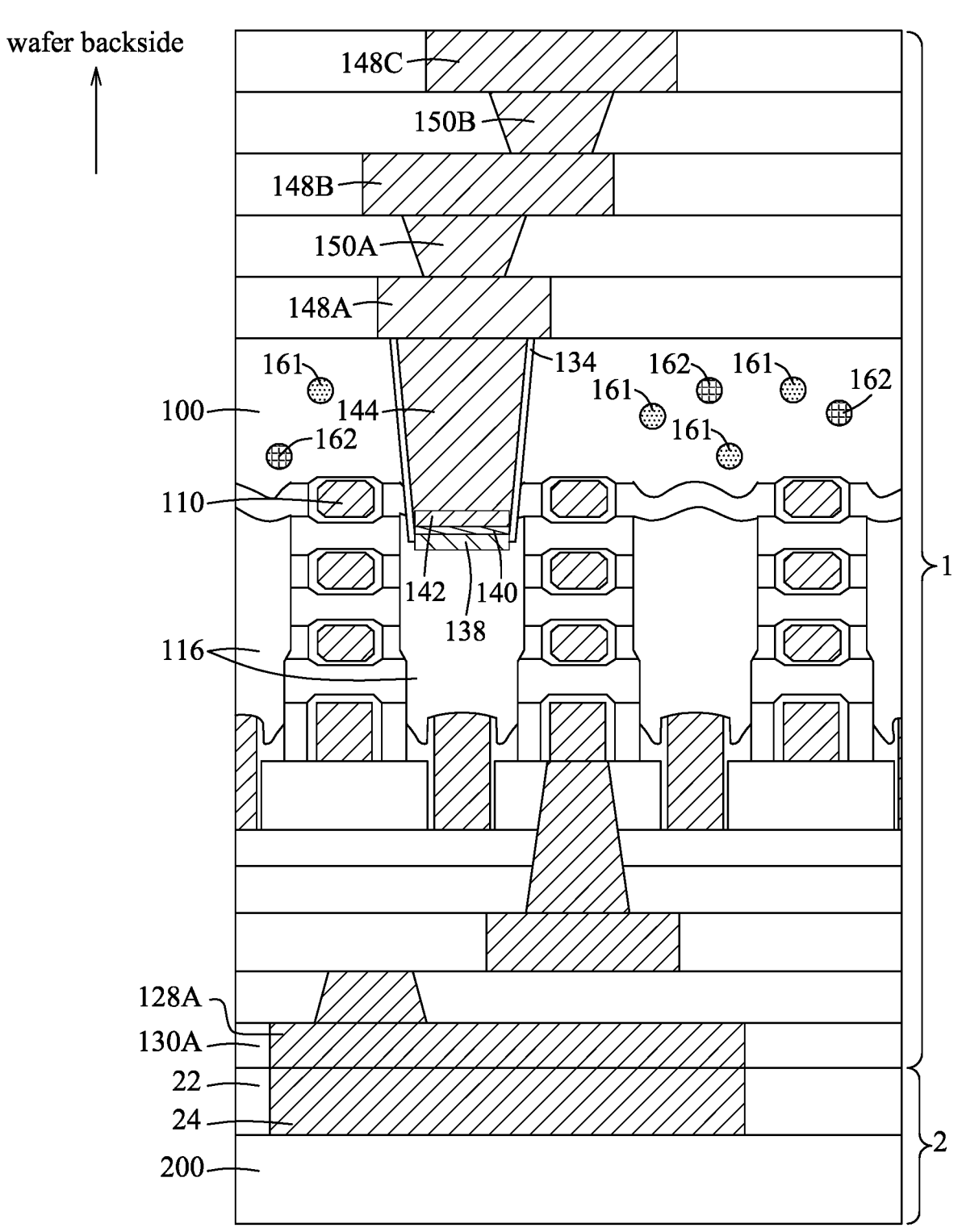
FIG. 21 is a schematic view illustrating a variation in accordance with some embodiments.

FIG. 21 illustrates a first variation of a circuit structure of the abovementioned embodiments. In FIG. 21, the device wafer 1 and the carrier wafer 2 are connected together by hybrid bonding. In such a scenario, the device wafer 1 has a frontside surface that is formed by a top metal layer 128A and a top dielectric layer 130A, the carrier wafer 2 has a frontside surface that is formed by a top metal layer 24 and a top dielectric layer 22, and the top metal layer 128A of the device wafer 1 is connected to the top metal layer 24 of the carrier wafer 2. In accordance with some embodiments, the top metal layers 128A, 24 of the device wafer 1 and the carrier wafer 2 may include, for example, Cu, other suitable materials, or any combination thereof. In accordance with some embodiments, the top dielectric layers 130A, 22 of the device wafer 1 and the carrier wafer 2 may include, for example, SiON, other suitable materials, or any combination thereof. In accordance with some embodiments, the top dielectric layer 22 of the carrier wafer 2 may have a thickness greater than 200 angstroms to achieve good bonding. Since the top metal layers 128A, 24 of the device wafer 1 and the carrier wafer 2 have good thermal conductivity, the hybrid bonding may be advantageous in terms of heat dissipation.

Figure 22:
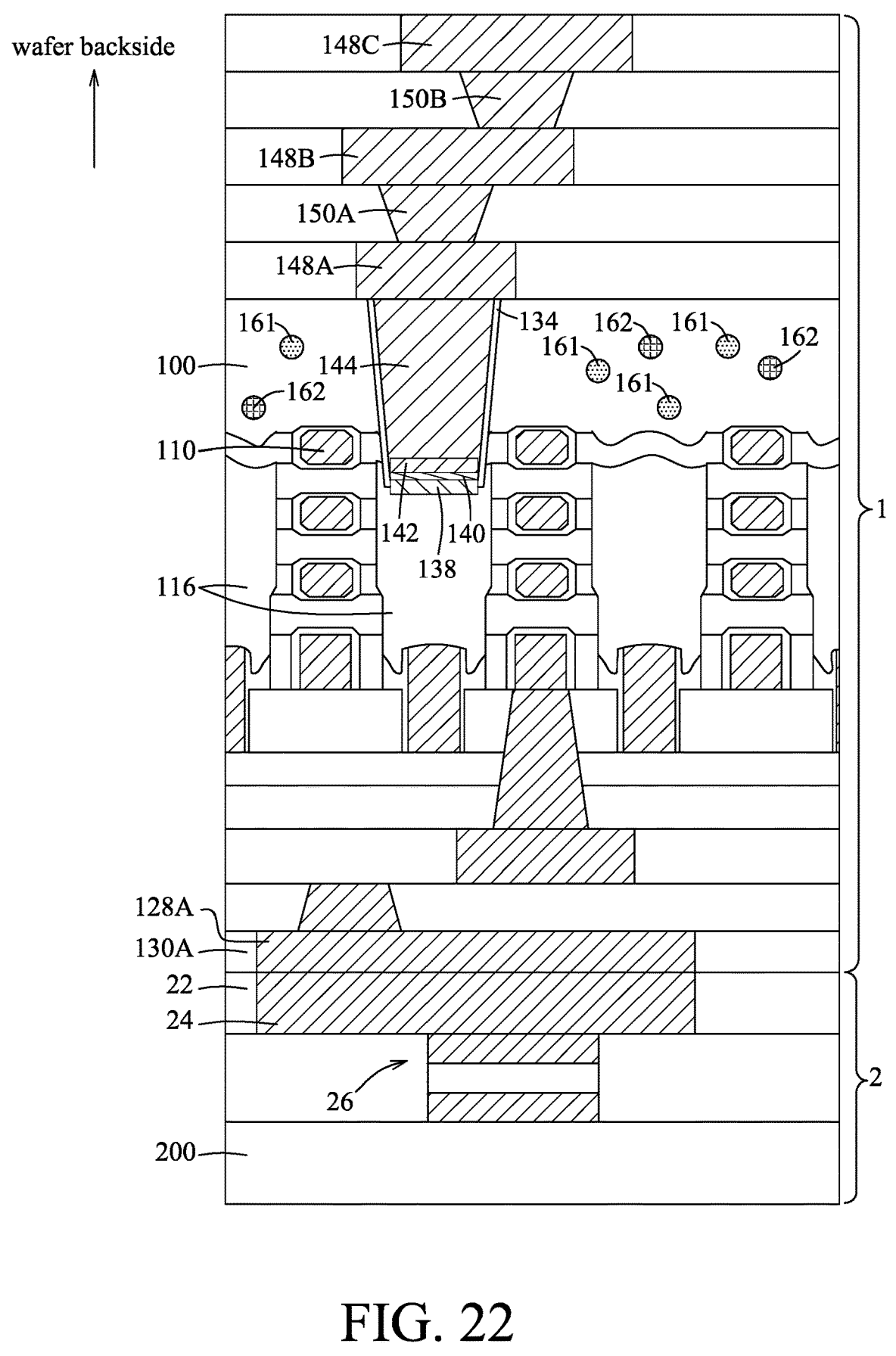

FIG. 22 illustrates a second variation of a circuit structure of the abovementioned embodiments, which differs from the first variation in that the carrier wafer 2 has a passive component 26 formed therein. In the illustrative embodiment, the passive component 26 has a metal-insulator-metal (MIM) structure, which may be used as a memory component. The MIM structure includes two metal electrodes, and an insulator feature sandwiched between the metal electrodes. In accordance with some embodiments, the metal electrodes may include, for example, TiN, TaN, WN, other suitable materials, or any combination thereof, and the insulator feature may include, for example, a high-k material (e.g., having a dielectric constant greater than 3.9), $HfO_2$, HfSiO, HfON, HfZrO, HfAlO, other suitable materials, or any combination thereof.

In summary, the contact plug 144 that is electrically connected to the circuit component is formed in the contact hole 132 by bottom-up metal growth, where the contact plug 144 is in contact with the dielectric liner layer 134. In order to achieve better metal sealing of the contact hole 132 so as to prevent the contact plug 144 from damage, the first dopants 161 that have an atomic size greater than Si are implanted into the substrate 100. In accordance with some embodiments, the second dopants 162 that include carbon and/or fluorine are further implanted into the substrate 100 to reduce RC delay of the entire circuit. In accordance with some embodiments, the annealing process is performed for restoration of damages resulting from the implantation process(es).

In accordance with some embodiments, a method for forming a contact plug is provided. In one step, a substrate is etched to form a contact hole in the substrate. The substrate is made of a material selected from a group consisting of Si and $SiO_2$. In one step, a dielectric liner layer is formed on a sidewall of the contact hole. In one step, the metal contact plug is formed in the contact hole, and is in contact with the dielectric liner layer. In one step, after the metal contact plug is formed, a first implantation process is performed on the substrate, so as to implant dopants having an atomic size greater than that of Si into the substrate.

In accordance with some embodiments, the first implantation process is one of a Ge implantation process, an Sn implantation process and a Pb implantation process.

In accordance with some embodiments, in one step, a second implantation process is performed on the substrate. The second implantation process is one of a carbon implantation process and a fluorine implantation process.

In accordance with some embodiments, after the step of performing the first implantation process, an annealing process is performed for restoring damages resulting from the first implantation process.

In accordance with some embodiments, the step of forming the metal contact plug includes the following actions. In one action, a metal contact layer is deposited to fill the contact hole. In one action, a chemical-mechanical planarization (CMP) process is performed to reveal the substrate that has a top surface where the metal contact plug is exposed. The first implantation process is performed on the top surface of the substrate where the metal contact plug is exposed.

In accordance with some embodiments, in one step, a second implantation process is performed on the top surface of the substrate where the metal contact plug is exposed. The second implantation process is one of a carbon implantation process and a fluorine implantation process.

In accordance with some embodiments, after the step of performing the first implantation process, an annealing process is performed for restoring damages resulting from the first implantation process.

In accordance with some embodiments, the annealing process has a process temperature in a range from 400° C. to 500° C.

In accordance with some embodiments, the substrate has a first surface and a second surface that are opposite to each other, and the first surface is above the second surface when viewed in a first direction. The substrate is formed with a metal wire layer above the first surface of the substrate when viewed in the first direction, and the contact hole is formed in the second surface of the substrate.

In accordance with some embodiments, a circuit structure is provided to include a circuit component, a metal contact plug, a dielectric liner layer and a plurality of first dopants. The circuit component is disposed in a substrate that is made of a material selected from a group consisting of Si and $SiO_2$. The metal contact plug is disposed in the substrate and electrically connected to the circuit component. The metal contact plug has a first end portion and a second end portion that are opposite to each other, with the second end portion being closer to the circuit component than the first end portion. The dielectric liner layer is disposed between the substrate and the metal contact plug, and is in contact with a lateral surface of the metal contact plug. The first dopants are disposed in a portion of the substrate that surrounds the first end portion of the metal contact plug, and have an atomic size greater than that of Si.

In accordance with some embodiments, the first dopants are selected from a group consisting of Ge, Sn and Pb.

In accordance with some embodiments, a plurality of second dopants are disposed in the portion of the substrate that surrounds the first end portion of the metal contact plug. The second dopants are selected from a group consisting of carbon and fluorine.

In accordance with some embodiments, a metal wire layer is disposed over the circuit component in a first direction. The metal contact plug is disposed above the circuit component when a second direction opposite to the first direction is considered an upward direction.

In accordance with some embodiments, a method for forming a contact plug is provided. In one step, a circuit component is formed in a substrate that is made of a material selected from a group consisting of Si and $SiO_2$. In one step, a metal wire layer is formed above the circuit component when viewed in a first direction. In one step, the substrate is etched to form a contact hole that is above the circuit component when a second direction opposite to the first direction is considered an upward direction. The circuit component is exposed from a bottom of the contact hole when the second direction is considered the upward direction. In one step, a dielectric liner layer is formed on a sidewall of the contact hole. In one step, the metal contact plug is formed in the contact hole, and is in contact with the dielectric liner layer. In one step, after the metal contact plug is formed, a plurality of first dopants that have an atomic size greater than that of Si are implanted into a surface of the substrate where the metal contact plug is exposed.

In accordance with some embodiments, the first dopants are selected from a group consisting of Ge, Sn and Pb.

In accordance with some embodiments, in one step, a plurality of second dopants are implanted into the surface of the substrate where the metal contact plug is exposed. The second dopants are selected from a group consisting of carbon and fluorine.

In accordance with some embodiments, after the step of implanting the first dopants, an annealing process is performed for restoring damages resulting from the implantation of the first dopants.

In accordance with some embodiments, the step of forming the metal contact plug includes the following actions. In one action, a metal contact layer is deposited to fill the contact hole to form the metal contact plug. In one action, a chemical-mechanical planarization (CMP) process is performed to reveal the surface of the substrate where the metal contact plug is exposed. The first dopants are implanted into the surface of the substrate where the metal contact plug is exposed.

In accordance with some embodiments, in one step, a plurality of second dopants are implanted into the surface of the substrate where the metal contact plug is exposed. The second dopants are selected from a group consisting of carbon and fluorine.

In accordance with some embodiments, after the step of implanting the first dopants, an annealing process is performed for restoring damages resulting from the implantation of the first dopants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

13

14

What is claimed is:

1. A method for forming a metal contact plug, comprising steps of:

etching a substrate to form a contact hole in the substrate, wherein the substrate is made of a material selected from a group consisting of Si and $SiO_2$;

forming a dielectric liner layer on a sidewall of the contact hole;

depositing a metal contact layer to fill the contact hole;

performing a planarization process to form a metal contact plug that is in contact with the dielectric liner layer in the contact hole, and to reveal the substrate that has a top surface where the metal contact plug is exposed; and performing, after the planarization process, a first implantation process on the top surface of the substrate, wherein the first implantation process is one of a Ge implantation process, an Sn implantation process and a Pb implantation process.

2. The method according to claim 1, further comprising a step of performing a second implantation process on the substrate, wherein the second implantation process is one of a carbon implantation process and a fluorine implantation process, thereby implanting dopants of carbon or fluorine, which were previously absent from the substrate, into the substrate.

3. The method according to claim 2, wherein the second implantation process forms one of SiOC and SiOF in the substrate.

4. The method according to claim 1, further comprising, after the step of performing the first implantation process, a step of performing an annealing process for restoring damages resulting from the first implantation process.

5. The method according to claim 1, further comprising a step of performing a second implantation process on the top surface of the substrate where the metal contact plug is exposed, wherein the second implantation process is one of a carbon implantation process and a fluorine implantation process.

6. The method according to claim 1, further comprising, after the step of performing the first implantation process, a step of performing an annealing process for restoring damages resulting from the first implantation process.

7. The method according to claim 6, wherein the annealing process has a process temperature in a range from 400° C. to 500° C.

8. The method according to claim 1, wherein the substrate has a first surface and a second surface that are opposite to each other, and the first surface is above the second surface when viewed in a first direction, and wherein the substrate is formed with a metal wire layer above the first surface of the substrate when viewed in the first direction, and the contact hole is formed in the second surface of the substrate.

9. The method according to claim 1, wherein a silicon-containing feature is exposed from the contact hole, and the method further comprises, after the dielectric liner layer is formed and before the metal contact layer is deposited, steps of:

conformally depositing a metal film on the substrate and in the contact hole, thereby forming a silicide layer at an interface between the silicon-containing feature and the metal film;

transforming the metal film into a metal nitride film by a plasma treatment that uses a gas including nitrogen; and removing a portion of the metal nitride film that is outside of the contact hole and a portion of the metal nitride film that is disposed on the sidewall of the contact hole, thereby forming a metal nitride layer at a bottom of the contact hole and over the silicide layer.

10. A method for forming a metal contact plug, comprising steps of:

forming a circuit component in a substrate that is made of a material selected from a group consisting of Si and $SiO_2$;

forming a metal wire layer above the circuit component when viewed in a first direction;

etching the substrate to form a contact hole that is above the circuit component when a second direction opposite to the first direction is considered an upward direction, the circuit component being exposed from a bottom of the contact hole when the second direction is considered the upward direction;

forming a dielectric liner layer on a sidewall of the contact hole;

forming the metal contact plug that is in contact with the dielectric liner layer in the contact hole;

performing, after the metal contact plug is formed, a first implantation process to implant a plurality of first dopants that have an atomic size greater than that of Si into a surface of the substrate where the metal contact plug is exposed, wherein the first dopants include one of Ge, Sn and Pb, which was previously absent from the substrate; and performing, after the metal contact plug is formed, a second implantation process to implant a plurality of second dopants into the surface of the substrate where the metal contact plug is exposed, wherein the second dopants include one of carbon and fluorine, which was previously absent from the substrate.

11. The method according to claim 10, further comprising, after the step of performing the first implantation process, a step of performing an annealing process for restoring damages resulting from the first implantation process.

12. The method according to claim 10, wherein the step of forming the metal contact plug includes:

depositing a metal contact layer to fill the contact hole to form the metal contact plug; and performing a chemical-mechanical planarization (CMP) process to reveal the surface of the substrate where the metal contact plug is exposed, and wherein, after the CMP process, the first dopants are implanted into the surface of the substrate where the metal contact plug is exposed.

13. The method according to claim 12, further comprising, after the step of performing the first implantation process, a step of performing an annealing process for restoring damages resulting from the first implantation process.

14. The method according to claim 10, wherein the circuit component has a silicon-containing feature that is exposed from the bottom of the contact hole, and the method further comprises, after the dielectric liner layer is formed and before the metal contact plug is formed, steps of:

conformally depositing a metal film on the substrate and in the contact hole, thereby forming a silicide layer at an interface between the silicon-containing feature and the metal film;

transforming the metal film into a metal nitride film by a plasma treatment that uses a gas including nitrogen; and

removing a portion of the metal nitride film that is outside of the contact hole and a portion of the metal nitride film that is disposed on the sidewall of the contact hole, thereby forming a metal nitride layer at the bottom of the contact hole and over the silicide layer.

15. The method according to claim 10, wherein the second implantation process creates one of SiOC and SiOF in the substrate.

16. A method for forming a metal contact plug, comprising steps of:

forming a circuit component in a frontside portion of a substrate, wherein the circuit component has a silicon-containing feature;

forming a contact hole in a backside portion of the substrate, wherein the backside portion of the substrate is made of Si or $SiO_2$;

forming a dielectric liner layer on a sidewall of the contact hole;

forming the metal contact plug in the contact hole in such a way that the dielectric liner layer is disposed between the metal contact plug and the substrate; and implanting fluorine into the backside portion of the substrate after the metal contact plug is formed.

17. The method according to claim 16, further comprising steps of:

forming a silicide layer on the silicon-containing feature and at a bottom of the contact hole after the step of forming the dielectric liner layer and before the step of forming the metal contact plug; and forming a metal nitride layer on the silicide layer after the step of forming the silicide layer and before the step of forming the metal contact plug, wherein the step of forming the silicide layer includes:

conformally depositing a metal film on the substrate and in the contact hole, thereby forming the silicide layer at an interface between the silicon-containing feature and the metal film, and wherein the step of forming the metal nitride layer includes:

transforming the metal film into a metal nitride film by a plasma treatment that uses a gas including nitrogen; and removing a portion of the metal nitride film that is outside of the contact hole and a portion of the metal nitride film that is disposed on the sidewall of the contact hole, thereby forming the metal nitride layer at the bottom of the contact hole and over the silicide layer.

18. The method according to claim 16, wherein the step of forming the metal contact plug in the contact hole includes:

depositing a metal contact layer to fill the contact hole; and performing, after depositing the metal contact layer, a planarization process to form the metal contact plug that is in contact with the dielectric liner layer in the contact hole, and to reveal the backside portion of the substrate that has a top surface where the metal contact plug is exposed.

19. The method according to claim 16, further comprising a step of implanting one of Ge, Sn and Pb into a top surface of the backside portion of the substrate after the metal contact plug is formed.

20. The method according to claim 16, wherein the fluorine, which was previously absent from the substrate, is implanted into a surface of the backside portion of the substrate where the metal contact plug is exposed, the method further comprising a step of:

implanting, after the metal contact plug is formed, one of Ge, Sn and Pb, which was previously absent from the substrate, into the surface of the backside portion of the substrate where the metal contact plug is exposed.

* * * * *